United States Patent
Lee et al.

(10) Patent No.: US 6,663,989 B2
(45) Date of Patent: *Dec. 16, 2003

(54) NON C-AXIS ORIENTED BISMUTH-LAYERED PEROVSKITE FERROELECTRIC STRUCTURE EPITAXIALLY GROWN ON BUFFERED SILICON

(75) Inventors: Ho Nyung Lee, Halle (DE); Stephan Senz, Halle (DE); Alina Visinoiu, Halle (DE); Alain Pignolet, Halle (DE); Dietrich Hesse, Halle (DE); Ulrich Gösele, Halle (DE)

(73) Assignee: Max-Planck-Institut fur Mikrostrukturphysik, Halle (DE)

( * ) Notice: Subject to any disclaimer, the term of this patent is extended or adjusted under 35 U.S.C. 154(b) by 8 days.

This patent is subject to a terminal disclaimer.

(21) Appl. No.: 10/109,319

(22) Filed: Mar. 28, 2002

(65) Prior Publication Data

US 2003/0008179 A1 Jan. 9, 2003

Related U.S. Application Data

(63) Continuation-in-part of application No. 09/875,630, filed on Jun. 6, 2001, now Pat. No. 6,531,235.

(51) Int. Cl.$^7$ .................................................. B32B 9/00
(52) U.S. Cl. ........................ 428/702; 428/701; 365/145
(58) Field of Search ................................. 117/944, 947; 501/134; 428/689, 699, 700, 701, 702; 252/519.13; 365/145

(56) References Cited

U.S. PATENT DOCUMENTS 5,270,298 A   12/1993   Ramesh
6,151,240 A * 11/2000   Suzuki ........................ 365/145

OTHER PUBLICATIONS

Lee et al., "Epitaxial growth of (103)–oriented ferroelectric SrBi2Ta2O9 thin films on Si(100)," Applied Physics Letters, American Institute of Physics (USA), vol. 78 (No. 19), p. 2922–2924, (May 7, 2001).

Lee et al., "Structural and electrical anisotropy of (001)–, (116)–, and (103)–oriented epitaxial SrBi2Ta2O9 thin films on SrTiO3 substrates grown by pulsed laser deposition," Journal of Applied Physics, American Institute of Physics (USA), vol. 88 (No. 11), p. 6658–6664, (Dec. 1, 2000).

Lee et al., "Growth and characterization of non–c–oriented epitaxial ferroelectric SrBi2Ta2O9 films on buffered Si(100)," Applied Physics Letters, American Institute of Physics (USA), vol. 77 (Nov. 20), p. 3260–3263, (Nov. 13, 2000).

Lee et al., "Epitaxial growth of non–c–oriented ferroelectric SrBi2Ta2O9 thin films on Si(100) substrates," Applied Physics A, Materials Science & Processing (Germany), p. 101–104, (Jun. 7, 2000).

Ishikawa et al., "Crystal structure and electrical properties of epitaxial SrBi2Ta2O9 films," Journal of Applied Physics, American Institute of Physics (USA), vol. 87 (Nov. 11), p. 8018–9023, (Jun. 1, 2000).

(List continued on next page.)

*Primary Examiner*—Deborah Jones
*Assistant Examiner*—Arden Sperty
(74) *Attorney, Agent, or Firm*—Jenkins, Wilson & Taylor, P.A.

(57) ABSTRACT

A structure containing a ferroelectric material comprises a substrate such as silicon, a buffer layer formed on the substrate, and a non-c-axis-oriented, electrically-conductive template layer formed on the buffer layer. The template layer comprises a perovskite oxide compound. An epitaxially a-axis-oriented ferroelectric layer is formed on the template layer, and has a vector of spontaneous polarization oriented perpendicular or at least substantially perpendicular to the film normal.

43 Claims, 14 Drawing Sheets

OTHER PUBLICATIONS

Lettieri et al., "Epitaxial growth of non–c–oriented SrBi2Nb2O9 on (111) SrTiO3," Applied Physics Letters, American Institute of Physics (USA), vol. 76 (No. 20), p. 2937–2939, (May 15, 2000).

Zurbuchen et al., "Morphology and Electrical Properties of Epitaxial SrBi2Nb2O9 Films," ISIF 2000 (Germany), p. 51, (Mar. 13, 2000).

Saito et al., "Characterization of Residual Stress Free (001)– and (116)–oriented SrBi2Ta2O9 Thin Films Epitaxially Grown on (001) and (110) SrTiO3 Single Crystals," ISIF 2000 (Germany), p. 71, (Mar. 13, 2000).

Scott, J., "Nano–Scale Ferroelectrics for Gbit Memory Application," ISIF 2000 (Germany), p. 102, (Mar. 14, 2000).

Pignolet et al., "Dependence of Ferroelectricity in Epitaxial Pulsed Laser Deposited Bismuth–Layered Perovskite Thin Films on the Crystallographic Orientation," ISIF 2000 (Germany), p. 111, (Mar. 14, 2000).

Pignolet et al., "Orientation dependence of ferroelectricity in pulsed–laser–deposited epitaxial bismuth–layered perovskite thin films," Applied Physics A, Materials Science & Processing (Germany), p. 283–291, (Feb. 23, 2000).

Moon et al., "Controlled growth of a–/ b– and c–axis oriented epitaxial SrBi2Ta2O9 thin films," Applied Physics Letters, American Institute of Physics (USA), vol. 75 (No. 18), p. 2827–2829, (Nov. 1, 1999).

Ishikawa et al., "Electrical properties of (001)– and (116)–oriented epitaxial SrBi2Ta2O9 thin films prepared by metalorganic chemical vapor deposition," Applied Physics Letters, American Institute of Physics (USA), vol. 75 (No. 13), p. 1970–1972, (Sep. 27, 1999).

Alexe et al., "Patterning and switching of nanosize ferroelectric memory cells," Applied Physics Letters, American Institute of Physics (USA), vol. 75 (No. 12), p. 1793–1795, (Sep. 20, 1999).

Gruverman, A., "Scaling effect on statistical behavior of switching parameters of ferroelectric capacitors," Applied Physics Letters, American Institute of Physics (USA), vol. 75 (Nov. 10), p. 1452–1454, (Sep. 6, 1999).

Nagahama et al., "Epitaxy of (106)–oriented SrBi2Ta2O9 and SrBi2Nb2O9 thin films," Thin Solid Films, Elsevier Science S.A. (Netherlands), vol. 353, p. 52–55, (1999).

Shimakawa et al., "Crystal structures and ferroelectric properties of SrBi2Ta2O9 and Sr0.8Bi2.2ta2O9," Applied Physics Letters, American Institute of Physics (USA), vol. 74 (No. 13), p. 1904–1906, (Mar. 29, 1999).

Lettieri et al., "Epitaxial growth of (001)–oriented and (110)–oriented SrBi2Ta2O9 thin films," Applied Physics Letters, American Institute of Physics (USA), vol. 73 (No. 20), p. 2923–2925, (Nov. 16, 1998).

Sanchez et al., "Epitaxial growth of SrTiO3 (00h), (0hh), and (hhh) thin films on buffered Si(001)," J. Mater. Res., Materials Research Society (USA), vol. 13 (No. 6), p. 1422–1425, (Jun. 1998).

Pignolet et al., "Epitaxial and Large Area PLD Ferroelectric Thin Film Heterstructures on Silicon Substrates," Integrated Ferroelectrics, Overseas Publishers Association (OPA) (Malaysia), vol. 21, p. 485–498, (1998). No Month.

Eom et al., "Single Crystal Thin Films of Conductive Oxides SrRuO3 and Ferroelectric Heterostructures," Integrated Ferroelectrics, Overseas Publishers Association (OPA) (Malaysia), vol. 21, p. 251–261, (1998). No Month.

Chen et al., "Epitaxial SrRuO3 thin films on (001) SrTiO3)," Applied Physics Letters, American Institute of Physics (USA), vol. 71 (No. 8), p. 1047–1049, (Aug. 25, 1997).

Hou et al., "Structure and properties of epitaxial Ba0.5Sr0.5TiO3/SrRuo3/ZrO2 heterostructure on Si grown by off–axis sputtering," Applied Physics Letters, American Institute of Physics (USA), vol. 67 (No. 10), p. 1387–1389, (Sep. 4, 1995).

Jia et al., "Deposition of epitaxial yttria–stabilized zirconia on single–crystal Si and subsequent growth of an amorphous SiO2 interlayer," Philosophical Magazine Letters, Taylor & Francis Ltd. (United Kingdom), vol. 72 (No. 6), p. 385–391, (1995). No Month.

Eom et al., "Single–Crystal Epitaxial Thin Films of the Isotropic Metallic Oxides Sr1–xCaxRuO2 (o < x < 1)," Science (USA), vol. 258, p. 1766–1769, (Dec. 11, 1992).

Rae et al., "Structure Refinement of Commensurately Modulated Bismuth Strontium Tantalate, Bi2SrTa2O9," Acta Cryst., International Union of Crystallography (England), vol. B48, p. 418–428, (1992). No Month.

Ramesh et al., "Ferroelectric PbZr0.2Ti0.8O3 thin films on epitaxial Y–Ba–Cu–O," Applied Physics Letters, American Institute of Physics (USA), vol. 59 (No. 27), p. 3542–3544, (Dec. 30, 1991).

Ramesh et al., "Epitaxial Cuprate Superconductor/Ferroelectric Heterostructures," Science (USA), vol. 252, p. 944–946, (May 17, 1991).

Fork et al., "Epitaxial yttria–stabilized zirconia on hydrogen–terminated Si by pulsed laser deposition," Applied Physics Letters, American Institute of Physics (USA), vol. 57 (No. 11), p. 1137–1139, (Sep. 10, 1990).

Zakharov et al., "Substrate temperature dependence of structure and resistivity of SrRuO3 thin films grown by pulsed laser deposition on (100) SrTiO3," J. Mater. Res., Materials Research Society (USA), vol. 14 (No. 11), p. 4385–4394, (Nov. 1999).

A–Paz de Araujo et al., "Fatigue–free ferroelectric capacitors with platinum electrodes," Nature (England), vol. 374, p. 627–629, (Apr. 13, 1995).

Park et al., "Lanthanum–substituted bismuth titanate for use in non–volatile memories," Nature, Macmillan Magazines Ltd. (England), vol. 401, p. 682–684, (Oct. 14, 1999).

Kingon, A., "Memories are made of . . . ," Nature, Macmillan Magazines Ltd. (England), vol. 401, p. 658–659, (Oct. 14, 1999).

Lee et al., "Structure and Morphology of Epitaxially Intergrown (100)– and (116)–Oriented SrBi2Ta2O9 Ferroelectric Thin Films on SrLaGaO4(110) Substrates," Mat. Res. Soc. Symp. Proc., Materials Research Society (USA), vol. 688, p. C8.5.1–C8.5.6, (2002). No Month.

Lee et al., "Epitaxial growth of ferroelectric SrBi2Ta2O9 thin films of mixed (100) and (116) orientation on SrLaGaO4(110)," Applied Physics Letters, American Institute of Physics (USA), vol. 79 (No. 18), p. 2961–2963, (Oct. 29, 2001).

Theis et al., "Adsorption–controlled growth of Bi4Ti3O12 by reactive MBE," Applied Physics Letters, American Institute of Physics (USA), vol. 72 (No. 22), p. 2817–2819, (Jun. 1, 1998).

Rae et al., "Structure Refinement of Commensurately Modulated Bismuth Titanate, Bi4Ti3O12," Acta Cryst., International Union of Crystallography (England), vol. B46, p. 474–486, (1990). No Month.

Cummins et al., "Electrical and Optical Properties of Ferroelectric Bi4Ti3O12 Single Crystals," Journal of Applied Physics (USA), vol. 39 (No. 5), p. 2268–2274, (Apr. 1968).

Watanabe et al., "Preparation and Characterization of a– and b–axes–oriented epitaxially grown Bi4Ti3O12–based thin films with long–range lattice matching," MRS Fall 2001, p. 53, (Nov. 27, 2001).

Lettieri et al., "Optimization of the growth of epitaxial SrBi2Ta2O9 thin films by pulsed laser deposition," Thin Solid Films, Elsevier Science B.V. (Netherlands), vol. 379, p. 64–71, (2000). No Month.

Shimakawa et al., "Crystal and electronic structures of Bi4–xLaxTi3O12 ferroelectric materials," Applied Physics Letters, American Institute of Physics (USA), vol. 79 (No. 17), p. 2791–2793, (Oct. 22, 2001).

Lee et al., "Anisotropic ferroelectric properties of epitaxially twinned Bi3.25La0.75Ti3O12 thin films grown with three different orientations," Applied Physics Letters, American Institute of Physics (USA), vol. 80 (No. 6), p. 1040–1042, (Feb. 11, 2002).

Gruverman et al., "Nanoscopic switching behavior of epitaxial SrBi2Ta2O9 films deposited by pulsed laser deposition," Applied Physics Letters, American Institute of Physics (USA), vol. 76 (No. 1), p. 106–108, (Jan. 3, 2002).

* cited by examiner

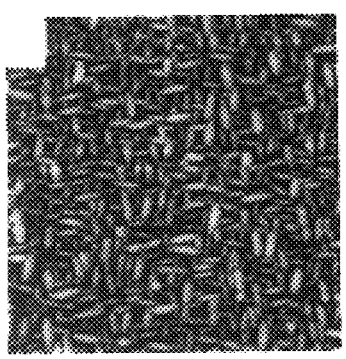 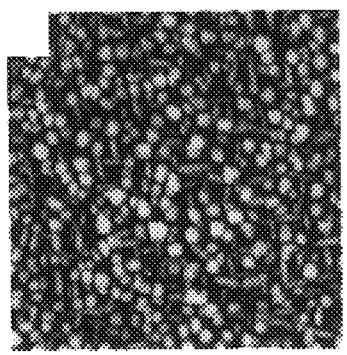 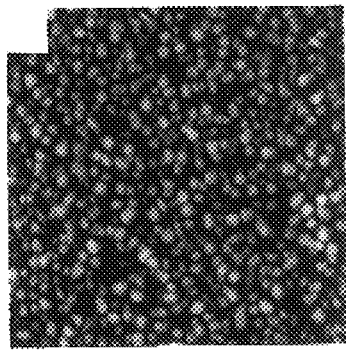
FIG. 11A  FIG. 11B  FIG. 11C
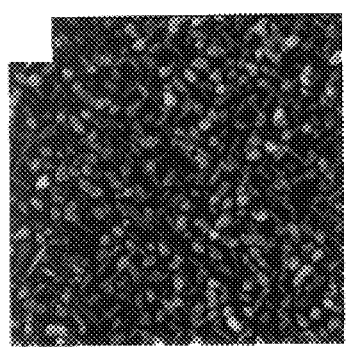 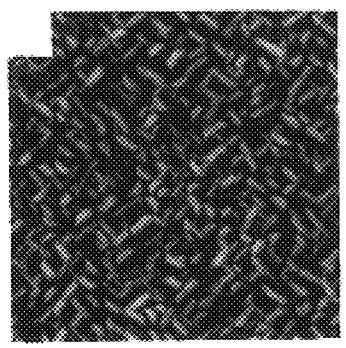 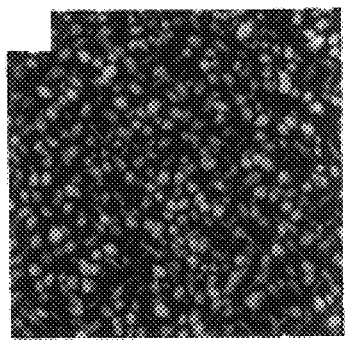
FIG. 11D  FIG. 11E  FIG. 11F
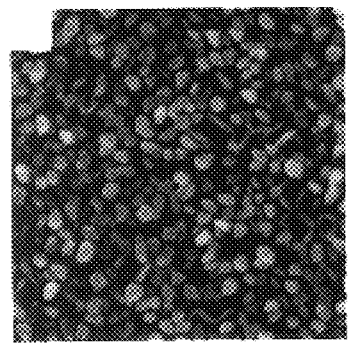 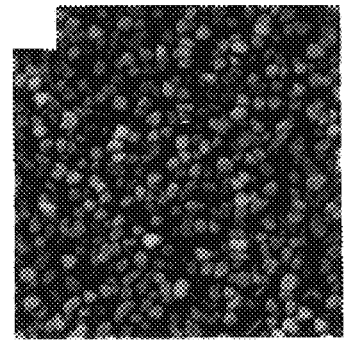 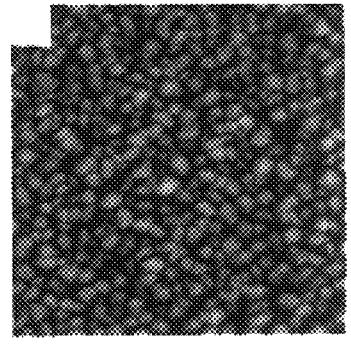
FIG. 11G  FIG. 11H  FIG. 11I
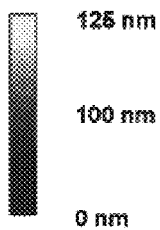

NON C-AXIS ORIENTED BISMUTH-LAYERED PEROVSKITE FERROELECTRIC STRUCTURE EPITAXIALLY GROWN ON BUFFERED SILICON

CROSS-REFERENCE TO RELATED APPLICATIONS

This application is a continuation-in-part of U.S. patent application Ser. No. 09/875,630 now U.S. Pat. No. 6,531,235 filed Jun. 6, 2001, the contents of which are incorporated herein by reference in its entirety.

TECHNICAL FIELD

The present application relates generally to the growth and structure of non-c-axis oriented ferroelectric materials. In particular, the present invention relates to anisotropic perovskite materials grown using a template layer formed on a buffered silicon substrate.

BACKGROUND ART

Ferroelectric perovskite materials are presently being studied as an alternative to conventional magnetic materials for use in digital memory systems. In particular, non-volatile memory devices are important computer components due to their ability to retain information after power has been removed or interrupted. Non-volatile memories that use ferroelectric thin films have been termed ferroelectric random access memories, or FRAMs or FERAMs. The structure of a FRAM cell can be similar to that of a conventional dynamic random access memory (DRAM) cell, but with the ferroelectric film replacing the dielectric material in the capacitor. Binary digital information is stored in the polarization states of the ferroelectric film.

Accordingly, numerous investigations of polycrystalline, bismuth-containing layered (i.e., anisotropic) perovskite thin films, such as $SrBi_2Ta_2O_9$ (SBT) and $SrBi_2Nb_2O_9$ (SBN) thin films, and La-substituted $Bi_4Ti_3O_{12}$ such as $Bi_{3.25}La_{0.75}Ti_3O_{12}$ (BLT), have been stimulated by prospective technical applications in ferroelectric nonvolatile memories. See, e.g., Arauio et al., "Fatigue-free ferroelectric capacitors with platinum electrodes," Nature 374, 627 (1995); Park et al., "Lanthanum-substituted bismuth titanate for use in non-volatile memories," Nature 401, 682 (1999). This is due in large part to the high fatigue endurance of SBT and other layered perovskite materials. However, the application of such polycrystalline perovskite materials suffers from certain limitations. For instance, it is difficult to obtain ferroelectric properties that are homogeneous over the different cells of a large capacitor array when the lateral size of the ferroelectric cells drops below 100 nm (corresponding to cell sizes needed for Gigabit memories). See Gruverman, "Scaling effect on statistical behavior of switching parameters of ferroelectric capacitors," Appl. Phys. Lett. 75,1452 (1999). It is believed that the use of epitaxial films is a way to overcome this non-uniformity problem of ferroelectric properties. See Kingon, "Memories are made of . . . ," Nature 401,658(1999). Moreover, the existence of ferroelectric properties and their dependence on the cell size and material in such small structures (i.e., size effect) has been recently addressed in Alexe et al., "Patterning and switching of nanosize ferroelectric memory cells," Appl. Phys. Lett. 75, 1793 (1999); and J. F. Scott: Abstracts of $12^{th}$ International Symposium on Integrated Ferroelectrics ("Nano-Scale Ferroelectrics for Gbit Memory Application"), Aachen, Germany, Mar. 12–15, 2000, p. 102.

Successful efforts in the epitaxial growth of SBT thin films deposited by pulsed laser deposition (PLD), metalorganic chemical vapor deposition (MOCVD), and RF magnetron sputtering methods, have been reported in Lettieri et al., "Epitaxial growth of (001)-oriented and (110)-oriented $SrBi_2Ta_2O_9$ thin films," Appl. Phys. Lett. 73, 2923 (1998); and Pignolet et al., "Orientation dependence of ferroelectricity in pulsed-laser-deposited epitaxial bismuth-layered perovskite thin films," Appl. Phys. A70, 283 (2000). In all of these works, special single crystalline substrates such as $SrTiO_3$, $LaAlO_3$-$Sr_2AlTaO_6$, $LaSrAlO_4$, and MgO of various orientations have been used to grow epitaxial c-axis-oriented as well as non-c axis oriented SBT thin films. It was generally found that c-axis-oriented epitaxial SBT films (i.e., films with their (001) plane parallel to the substrate surface) can be grown on $SrTiO_3$ (100) substrates, whereas epitaxial SBT films that have the (116) and (103) plane parallel to the substrate surface, grow on $SrTiO_3$(110) and (111) substrates, respectively. In Lettieri et al., "Epitaxial growth of non-c-oriented $SrBi_2Nb_2O_9$ on (111) $SrTiO_3$," Appl. Phys. Lett. 76, 2937 (2000), properly oriented ferroelectric films were epitaxially grown on $SrTiO_3$. Specifically, it was reported that heterostructures consisting of an underlying (111) $SrRuO_3$ epitaxial electrode and an epitaxial (103) $SrBi_2Nb_2O_9$ overlayer were prepared, as $SrRuO_3$ is closely lattice matched with $SrTiO_3$ and chemically compatible with both $SrBi_2Nb_2O_9$ and $SrTiO_3$.

The above observations are, however, not of high practical significance for memory devices, because $SrTiO_3$ crystals are not suitable substrates in microelectronics. For a better compatibility with silicon-based microelectronics, epitaxial SBT films should be grown on silicon substrates. The epitaxial growth of non-c-axis-oriented SBT on Si(100) has not heretofore been reported. As a general matter, it is widely acknowledged that the integration of complex ferroelectric materials with silicon-based devices has been elusive to date. See, e.g., Kingon, "Memories are made of . . . ," Nature 401, 658 (1999).

The growth of non-c-oriented bismuth-containing ferroelectric films having a layered perovskite structure, such as $SrBi_2Ta_2O_9$ (SBT), $SrBi_2Nb_2O_9$ (SBN) and $SrBi_2(Ta,Nb)_2O_9$ (SBTN), is of particular significance because the vector of the spontaneous electrical polarization in these layered perovskite materials is directed along the a-axis. By contrast, a c-oriented layered perovskite material does not have a polarization component along its film normal (perpendicular to the film plane). However, if the layered perovskite material is to be used in a ferroelectric thin-film capacitor with electrodes on the top and bottom film surfaces as in the geometry used for dynamic random access memory, a normally oriented polarization component is essential. It would therefore be desirable to grow non-c-axis-oriented layered perovskite materials.

One example of a c-axis oriented silicon/metal oxide heterostructure that, for the purposes of the present invention, is not desirable, is disclosed in U.S. Pat. No. 5,270,298. Specifically, a buffer layer of yttria-stabilized zirconia is grown on a silicon substrate. A template of a c-axis oriented anisotropic perovskite material, such as bismuth titanate ($Bi_4Ti_3O_{12}$) is grown on the buffer layer. A cubic metal oxide such as a perovskite material of highly-oriented crystallinity is then able to be grown on the template layer. In the example provided in this patent, the metal oxide is $Pb_{1-y}La_yZr_{1-x}Ti_xO_3$ (PLZT), where $0<x<1$ and $0<y<1$.

Epitaxial $SrRuO_3$ thin films, have been found useful as electrodes for ferroelectric capacitors, due to the high thermal and chemical stability of $SrRuO_3$ and because of its good lattice match with $SrTiO_3$ and $Pb(ZrTi)O_3$. $SrRuO_3$ is a pseudocubic perovskite with a slight orthorhombic distortion due to the tilting of the $RuO_6$ octahedra. High-quality epitaxial $SrRuO_3$ films have been successfully deposited on different substrates, such as $SrTiO_3(100)$ and $LaAlO_3(100)$ and by different methods like off-axis sputtering and PLD, as reported in Eom et al., "Single-Crystal Epitaxial Thin Films of the Isotropic Metallic Oxides $Sr_{1-x}Ca_xRuO_3$ ($0 \leq x \leq 1$)," *Science* 258,1766 (1992); Chen et al., "Epitaxial $SrRuO_3$ thin films on (001) $SrTiO_3$," *Appl. Phys. Lett.* 71, 1047 (1997); and Zakharov et al., "Substrate temperature dependence of structure and resistivity of $SrRuO_3$ thin films grown by pulsed laser deporition on (100) $SrTiO_3$," *J. Mater. Res.* 14, 4385 (1999).

Recently, epitaxial (116)- and (103)-oriented SBT thin films grown on $SrRuO_3$ base electrodes deposited on lattice-matched perovskite $SrTiO_3$ substrates have been demonstrated by Ishikawa et al., "Electrical properties of (001)- and (116)-oriented epitaxial $SrBi_2Ta_2O_9$ thin films prepared by metalorganic chemical vapor deposition," *Appl. Phys. Lett.* 75, 1970 (1999); Zurbuchen et al.: Abstracts of $12^{th}$ International Symposium on Integrated Ferroelectrics ("Morphology and Electrical Properties of Epitaxial $SrBi_2Ta_2O_9$ Films"), Aachen, Germany, Mar. 12–15, 2000, p. 51; Saito et al.: Abstracts of $12^{th}$ International Symposium on Integrated Ferroelectrics ("Characterization of Residual Stress Free (001)- and (116)-oriented $SrBi_2Ta_2O_9$ Thin Films Epitaxially Grown on (001) and (110) $SrTiO_3$ Single Crystals"), Aachen, Germany, Mar. 12–15, 2000, p. 71; Piqnolet et al., Abstracts of $12^{th}$ International Symposium on Integrated Ferroelectrics ("Dependence of Ferroelectricity in Epitaxial Pulsed Laser Deposited Bismuth-Layered Perovskite Thin Films on the Crystallographic Orientation"), Aachen, Germany, Mar. 12–15, 2000, p.111; and Lettieri et al., "Epitaxial growth of non-c-oriented $SrBi_2Nb_2O_9$ on (111) $SrTiO_3$," *Appl. Phys. Lett.* 76, 2937 (2000). However, as discussed above, these substrates are not suitable for use in the fabrication of integrated devices for microelectronic applications.

DISCLOSURE OF THE INVENTION

According to one embodiment of the present invention, a structure containing a ferroelectric material comprises a substrate comprising silicon, a buffer layer formed on the substrate, and a non-c-axis-oriented, electrically-conductive template layer formed on the buffer layer. The template layer comprises a perovskite oxide compound. A non-c-axis-oriented, anisotropic perovskite ferroelectric layer is formed on the template layer.

According to another embodiment of the present invention, a structure containing a ferroelectric material comprises a substrate comprising (100)-oriented silicon, a buffer layer comprising (100)-oriented, yttria-stabilized zirconia formed on the substrate, an electrically-conductive template layer formed on the buffer layer in which the template layer comprises a (110)-oriented perovskite oxide compound, and a (116)-oriented, layered perovskite ferroelectric film formed on the template layer.

According to yet another embodiment of the present invention, a structure containing a ferroelectric material comprises a substrate comprising (100)-oriented silicon, a buffer layer comprising (100)-oriented, yttria-stabilized zirconia formed on the substrate a buffer layer comprising (111)-oriented magnesium oxide formed on the yttria-stabilized zirconia, an electrically-conductive template layer formed on the buffer layer in which the template layer comprises a (111)-oriented perovskite oxide compound, and a (103)-oriented, layered perovskite ferroelectric film formed on the template layer.

According to still another embodiment of the present invention, an epitaxial, Aurivillius-phase metal oxide/crystalline silicon heterostructure structure is provided in which the Aurivillius-phase metal oxide has a crystallographic c-axis. The structure comprises a crystalline silicon substrate having a (100) orientation, a buffer layer structure epitaxially oriented upon the crystalline silicon substrate, and an electrically conducting epitaxial template layer. The electrically conducting epitaxial template layer comprises an anisotropic perovskite that is formed epitaxially on the epitaxial buffer layer structure. The buffer layer structure causes the epitaxial template layer to be grown with a substantially non-c-axis orientation. The epitaxial, Aurivillius-phase metal oxide layer is formed upon the epitaxial template layer and has a substantially non-c axis orientation. The epitaxial, Aurivillius-phase metal oxide layer has an electrical polarization almost or exactly perpendicular to the crystallographic c-axis. The electrical polarization thus has a non-zero component perpendicular to the epitaxial, Aurivillius-phase metal oxide layer.

According to an additional aspect of the present invention, a method is provided for epitaxially growing a layer of a non-c-axis oriented ferroelectric material. In this method, a non-c-axis oriented, electrically conductive template layer comprising a perovskite oxide compound is formed on a zirconia-buffered, silicon-containing substrate. A non-c-axis oriented ferroelectric material is grown on the template layer.

The growth of epitaxial films in one of the non-c-axis orientations, for example (118) and (104) for BLT or (116) and (103) for SBT, with the (major) spontaneous polarization vector being inclined to the film plane, was originally disclosed in copending, commonly assigned U.S. patent application Ser. No. 09/875,630 filed Jun. 6, 2001, the contents of which are incorporated herein by reference in its entirety. In accordance with the present disclosure, it is believed that the best choice would be (100)-oriented ("a-axis-oriented") epitaxial films, because in this case the (major) polarization vector would be perpendicular to the film plane and result in a maximum value of the remanent polarization. Such a-axis-oriented films have heretofore been grown only on complex-oxide single-crystal substrates that are not suitable for use in the fabrication of integrated devices for microelectronic applications. To enable the integration of bismuth-layered perovskite films into silicon-based microelectronics, the growth of uniformly a-axis-oriented epitaxial films on electroded Si substrates is necessary and has been a long-standing challenge so far.

Accordingly, the present invention successfully demonstrates the epitaxial growth of a-axis-oriented ferroelectric thin films on substrates suitable for integrated microelectronic devices, such as Si(100) substrates, covered with a very thin, strained (110)-oriented electrode layer, such as $SrRuO_3$, on a buffer layer such as (100)-oriented yttria-stabilized zirconia (YSZ). In specific examples, the orientation of BLT films turned out to critically depend on the thickness of the (110)-oriented $SrRuO_3$ electrode layer, with (100) and (118) BLT orientations competing. A comprehensive variation of the $SrRuO_3$ electrode layer thickness and of other deposition conditions enabled the growth of uniformly a-axis-oriented BLT films on Si(100).

Therefore, according to another embodiment of the present invention, a structure containing a ferroelectric material comprises a substrate comprising a (100)-oriented material, a buffer layer formed on the substrate and having a (100) orientation, a template layer formed on the buffer layer and comprising a (110)-oriented perovskite oxide compound, and an epitaxially a-axis-oriented ferroelectric layer formed on the template layer. The ferroelectric layer exhibits a vector of spontaneous polarization oriented substantially normal to a plane of the ferroelectric layer.

According to yet another embodiment of the present invention, a structure containing a ferroelectric material comprises a substrate comprising a (100)-oriented material, a buffer layer formed on the substrate and comprising YSZ (100), a template layer formed on the buffer layer and comprising a (110)-oriented perovskite oxide compound, and an epitaxially a-axis-oriented ferroelectric layer comprising $Bi_4Ti_3O_{12}$ formed on the template layer. The ferroelectric layer exhibits a vector of spontaneous polarization oriented substantially normal to a plane of the ferroelectric layer.

According to still another embodiment of the present invention, a structure containing a ferroelectric material comprises a substrate comprising a (100)-oriented material, a buffer layer formed on the substrate and comprising YSZ (100), a template layer formed on the buffer layer and comprising a (110)-oriented perovskite oxide compound, and an epitaxially a-axis-oriented ferroelectric layer comprising $SrBi_2Ti_2O_9$ the ferroelectric layer formed on the template layer. The ferroelectric layer exhibits a vector of spontaneous polarization oriented substantially normal to a plane of the ferroelectric layer.

The present invention also provides a method for epitaxially growing a layer of a-axis oriented ferroelectric material that comprises the following steps. A template layer is formed by depositing a (110)-oriented perovskite oxide compound on a (100)-oriented substrate buffered with a (100)-oriented buffer layer. An epitaxially a-axis oriented ferroelectric layer is grown on the template layer. The ferroelectric layer so grown exhibits a vector of spontaneous polarization oriented substantially normal to a plane of the ferroelectric layer.

Certain process conditions are found to be preferable in successfully growing the a-axis ferroelectric layer having the advantageous characteristics described herein. First, the perovskite oxide compound, which preferably comprises strontium ruthenate or lanthanum nickelate, is deposited to a thickness of approximately 10 to approximately 15 nm, thereby in effect stretching this template layer quite thin to optimize its use as a template layer for the growth of (100)-oriented nuclei. Second, the material of the ferroelectric layer is deposited at a rate of approximately 100 to approximately 200 nm/min to promote the growth of (100)-oriented nuclei. Third, the oxygen pressure is maintained at approximately 0.9 mbar to approximately 5 mbar during growth of the ferroelectric layer to suppress re-evaporation of bismuth-containing species.

The present invention further provides non-c-axis, including a-axis, oriented ferroelectric structures produced according to the methods summarized and described herein.

It is therefore an object of the present invention to provide a structure, and a method for growing the same, that contains a non-c-axis oriented ferroelectric film, which structure exhibits properties useful in the development of data storage devices.

It is a further object of the present invention to provide a template on a buffered silicon substrate suitable for the growth of a non-c-axis oriented ferroelectric film.

Some of the objects of the invention having been stated hereinabove, other objects will become evident as the description proceeds when taken in connection with the accompanying drawings as best described hereinbelow.

BRIEF DESCRIPTION OF THE DRAWINGS

FIGS. 11A–11C are 5×5 $\mu m^2$ AFM topography images of BLT films grown on $SrRuO_3$ (110)/YSZ (100) according to the present invention;

FIGS. 11D–11I are 5×5 $\mu m^2$ AFM topography images of BLT films grown on $SrRuO_3$ (110)/YSZ(100)/Si(100) according to the present invention;

DETAILED DESCRIPTION OF THE INVENTION

For purposes of the present disclosure, it will be understood that when a given component such as a layer, region or substrate is referred to herein as being disposed or formed "on" another component, that given component can be directly on the other component or, alternatively, intervening components (for example, one or more buffer layers, interlayers, electrodes or contacts) can also be present. It will be further understood that the terms "disposed on" and "formed on" are used interchangeably to describe how a given component is positioned or situated in relation to another component. Hence, the terms "disposed on" and "formed on" are not intended to introduce any limitations relating to particular methods of material transport, deposition, or fabrication.

As used herein, the abbreviation YSZ refers to yttria-stabilized zirconia ($ZrO_2$) or similarly stabilized zirconia.

As used herein, the abbreviation SBT refers to $SrBi_2Ta_2O_9$. Both of these terms are intended to also cover derivatives and slightly modified compositions of $SrBi_2Ta_2O_9$, with or without impurities such as dopants.

As used herein, the abbreviation SBN refers to $SrBi_2Nb_2O_9$. Both of these terms are intended to also cover derivatives and slightly modified compositions of $SrBi_2Nb_2O_9$, with or without impurities such as dopants.

As used herein, the abbreviation SBTN refers to $SrBi_2(Ta,Nb)_2O_9$. Both of these terms are intended to also cover derivatives and slightly modified compositions of $SrBi_2(Ta,Nb)_2O_9$, with or without impurities such as dopants.

As used herein, the abbreviation BLT refers to bismuth titanate ($Bi_4Ti_3O_{12}$) doped with lanthanum (i.e., La-substituted or La-doped $Bi_4Ti_3O_{12}$). These terms are intended to also cover derivatives and slightly modified compositions of $Bi_4Ti_3O_{12}$, with or without dopants such as lanthanum or other rare earth ions such as Pr, Nd and Sm.

The term "Aurivillius-type perovskites" or "Aurivillius-family perovskites" is to be construed interchangeably with the term "bismuth-layered perovskites" or "Bi-layered perovskites."

Terms relating to crystallographic orientations, such as Miller indices and angles in relation to the plane of a layer of material, are intended to cover not only the exact value specified (e.g., (116), 45° and so on) but also any small deviations from such exact value that might be observed.

Figure 1:
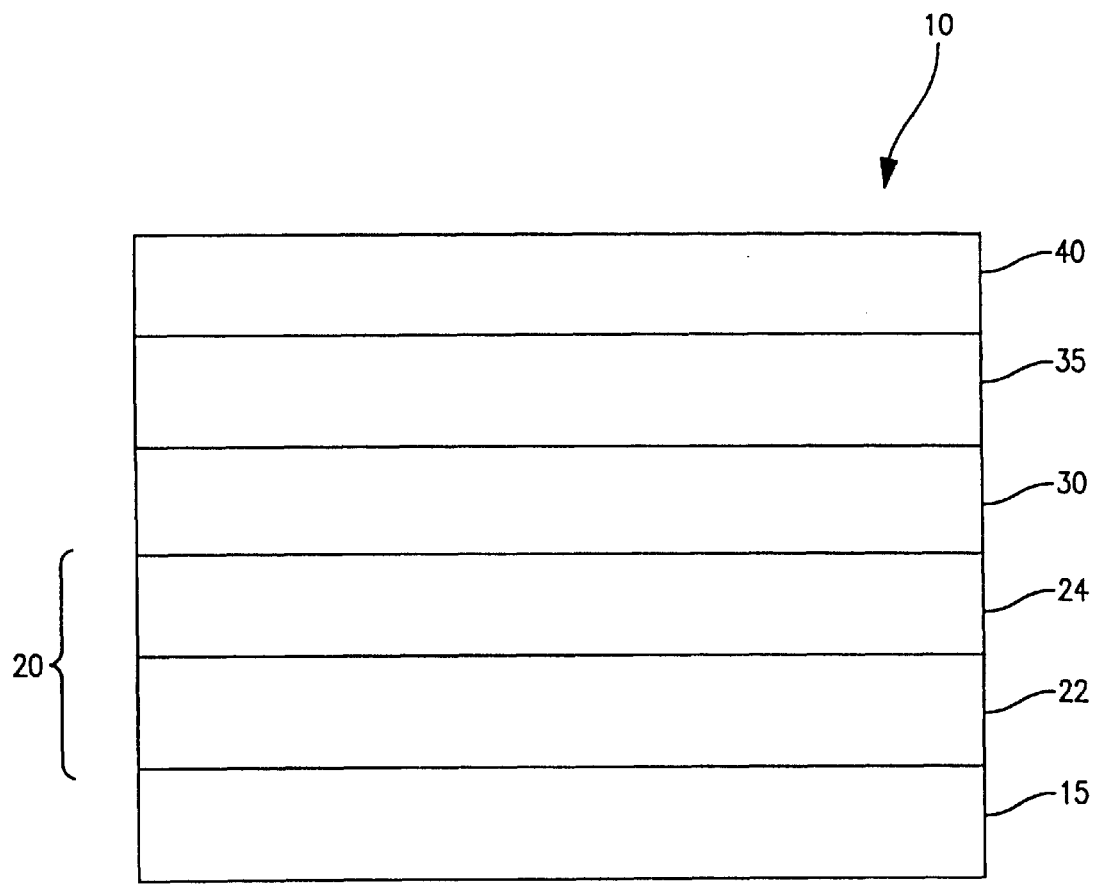
FIG. 1 is a simplified cross-sectional view of the basic layers of a structure provided according to the present invention.

Referring now to FIG. 1, there is illustrated a heterostructure, generally designated 10, that contains a non-c-axis-oriented, bismuth-layered perovskite ferroelectric film epitaxially grown on buffered silicon. Accordingly, heterostructure 10 comprises a wafer or substrate 15 of silicon, which has a (100) orientation and is covered with a (100)-oriented buffer layer 20. A template layer 30 comprising a non-c-axis-oriented, electrically conductive, oxide-containing material is deposited on buffer layer 20. In accordance with the present invention, the composition and structure of template layer 30 are such that template layer 30 provides a template suitable for enabling the epitaxial growth of a layer of non-c-axis-oriented, anisotropic ferroelectric material 35 preferably exhibiting a bismuth-containing perovskite structure. Preferably, template layer 30 is a cubic or pseudo-cubic perovskite metal oxide. Non-limiting examples of suitable template layers 30 include strontium ruthenate ($SrRuO_3$) and lanthanum nickelate ($LaNiO_3$). For the purpose of fabricating a device that benefits from the use and properties of ferroelectric layer 35, an electrically conductive layer 40 such as an electrode or a contact can be disposed on ferroelectric layer 35. Template layer 30 can thus serve as a bottom electrode for ferroelectric layer 35. Various deposition methods understood by persons skilled in the art can be employed in forming the several layers described herein, and the present invention is not limited to the use of any particular deposition or material transport technique.

In a first specific embodiment according to the present invention, buffer layer 20 comprises zirconia ($ZrO_2$) that is stabilized with a suitable substance such as yttria. Thus, buffer layer 20 preferably comprises (100)-oriented yttria-stabilized zirconia (YSZ) deposited on substrate 15. The use of the (100)-oriented YSZ as buffer layer 20 enables the growth of template layer 30 comprising (110)-oriented perovskite materials such as $SrRuO_3$ and $LaNiO_3$. Ferroelectric layer 35 having a (116) orientation can then be successfully epitaxially grown on (110)-oriented template layer 30. Non-limiting examples of suitable non-c-axis-oriented, anisotropic ferroelectric materials 35 include SBT ($SrBi_2Ta_2O_9$), SBN ($SrBi_2Nb_2O_9$), and SBTN ($SrBi_2(Ta,Nb)_2O_9$).

In a second specific embodiment according to the present invention, ferroelectric layer 35 is a non-c-oriented epitaxial film comprising bismuth titanate ($Bi_4Ti_3O_{12}$), which can be doped with lanthanum (La) and has a (118) orientation. Accordingly, referring to FIG. 1 and the first specific embodiment just described, the bismuth titanate or lanthanum-substituted bismuth titanate is substituted for the SBT, SBN, or SBTN.

Regarding the ferroelectric films specified for the first and second embodiments, Miller indices—e.g., (116) and (118)—have been used to describe very specific, exact crystallographic orientations. According to the present invention, however, the orientations of the ferroelectric films can be generalized by considering the angle that the c-axis of ferrorelectric layer 35 forms with the plane of substrate 15. The Miller indices, on the other hand, describe very exact values of the angle from the substrate plane. The (118) orientation given for bismuth titanate corresponds to the (116) orientation given for SBT, SBN, or SBTN. The difference in the respective Miller indices results from the fact that bismuth titanate has a different lattice parameter c than that of SBT, SBN, or SBTN. Moreover, other equivalent Aurivillius phases, now known or subsequently developed, may have different lattice parameters and hence different Miller indices. Therefore, the materials having (116) and (118) orientations can be generalized within the scope of the present disclosure by stating that the c-axis of ferroelectric layer 35 is tilted approximately 45° plus or minus a small deviation or tolerance (e.g., ±3°) from the substrate plane. The tolerance in the angle accounts for the belief that exact angles might not actually be observed in nature for a given material, but rather a small deviation in the value for the angle might occur due to crystallographic reasons. It therefore will be understood that the use herein of orientation-related or angular terms such as (116) or 45° is intended to cover not only the exact value given but also small deviations therefrom.

In a third specific embodiment according to the present invention, buffer layer 20 comprises more than one component layer. Referring again to FIG. 1, a first component layer 22 comprises the (100)-oriented YSZ. A second component layer 24, preferably comprising (111)-oriented MgO and/or TiN, is grown on YSZ-containing first component layer 22. The use of such (111)-oriented films deposited on the YSZ (100)/Si (100) system enables the growth of template layer 30 comprising (111)-oriented perovskite materials such as $SrRuO_3$ and $LaNiO_3$. Ferroelectric layer 35 having a (103) orientation can then be successfully epitaxially grown on (111)-oriented template layer 30. As in previously described embodiments, non-limiting examples of suitable non-c-axis-oriented, anisotropic ferroelectric materials 35 include SBT ($SrBi_2Ta_2O_9$), SBN ($SrBi_2Nb_2O_9$), and SBTN ($SrBi2(Ta,Nb)_2O_9$).

In a fourth specific embodiment according to the present invention, ferroelectric layer 35 is a non-c-oriented epitaxial film comprising bismuth titanate ($Bi_4Ti_3O_{12}$), which can be doped with lanthanum (La) and has a (104) orientation. Accordingly, referring to FIG. 1 and the third specific embodiment just described, the bismuth titanate or lanthanum-substituted bismuth titanate is substituted for the SBT, SBN, or SBTN. As analogously indicated hereinabove with respect to the first and second specific embodiments, the orientations of the ferroelectric films of the third and fourth embodiments can be generalized by considering the angle that the c-axis of ferroelectric layer 35 forms with the plane of substrate 15. The (104) orientation given for bismuth titanate corresponds to the (103) orientation given for SBT, SBN, or SBTN. The materials having (103) and (104) orientations can therefore be generalized within the scope of the present disclosure by stating that the c-axis of ferroelectric layer 35 is tilted approximately 55° plus or minus a small deviation or tolerance (e.g., ±3°) from the substrate plane.

It will be understood that other non-c-oriented epitaxial films comprising other Aurivillius-type materials may be grown on the silicon substrate structures in accordance with the present invention.

Heterostructure 10 provided in accordance with any of the embodiments described hereinabove can be used in a ferroelectric thin-film capacitor or other device for random access memory (RAM) applications, such as dynamic random access memory (DRAM). As one example, a ferroelectric capacitor is provided in which ferroelectric layer 35 is sandwiched between conductive layer 40, such as a metal or conductive oxide electrode, and template layer 30 serving as a bottom electrode.

EXAMPLE 1

A PLD technique was employed to deposit SBT and $SrRuO_3$ thin films as well as YSZ using a PLD setup similar to that described previously in Pignolet et al., "Orientation dependence of ferroelectricity in pulsed-laser-deposited epitaxial bismuth-layered perovskite thin films," *Appl. Phys.* A70, 283 (2000); and Pignolet et al., "Epitaxial and Large Area PLD Ferroelectric Thin Film Heterostructures on Silicon Substrates," *Integr. Ferroelectr.* 21, 485 (1998). Briefly, a KrF excimer laser ($\lambda$=248 nm), operating at a repetition rate of 5 Hz with an energy density of 2–4 $J/cm^2$, was used to deposit SBT thin films onto $SrRuO_3$/YSZ/Si(100). The base pressure in the chamber was $5\times10^{-8}$ mbar before raising the substrate temperature. Wafers of p-Si(100) with a resistivity of 1–5 $\Omega$ cm were used as substrates. An epitaxial YSZ thin film 75 nm thick was first grown on the Si(100) substrate at a substrate temperature of 800° C. with a flowing $O_2$ pressure of $1.7\times10^{-3}$ mbar. Details on the epitaxial growth of YSZ on Si have been described previously in Fork et al., "Epitaxial yttria-stabilized zirconia on hydrogen-terminated Si by pulsed laser deposition," *Appl. Phys. Lett.* 57, 1137 (1990); and Jia et al., "Deposition of epitaxial yttria-stabilized zirconia on single-crystal Si and subsequent growth of an amorphous $SiO_2$ interlayer," *Philos. Mag. Lett.* 72, 385 (1995). The $SrRuO_3$ film with a thickness of 100 nm was deposited at 775° C. in 0.14 mbar of $O_2$ pressure using a laser energy density of 1.7 $J/cm^2$. Finally, 150 nm thick SBT thin films were grown with the substrate temperature and oxygen chamber pressure fixed at 740° C. and 0.2 mbar, respectively. All layers were deposited in the same chamber by changing the targets without breaking the vacuum. After the SBT film deposition, the samples were cooled to room temperature in 0.4 mbar of oxygen to prevent bismuth loss in the SBT film. Detailed deposition conditions are summarized in Table 1 hereinbelow. Crystallographic orientations and epitaxial relations were characterized by X-ray diffraction (XRD) $\theta$-$2\theta$ scans and pole figure measurements using a Philips X'PERT MRD™ 4-circle diffractometer. Cu $K_a$ radiation and a parallel plate collimator in front of the detector with $2\theta$ resolution of 0.1° were used. The pole figures were measured using an open Eulerian cradle.

TABLE 1

Growth Conditions for SBT, $SrRuO_3$, and YSZ Thin Films by PLD

| | SBT | $SrRuO_3$ | YSZ |
|---|---|---|---|
| Target | $SrBi_{2.6}Ta_2O_9$ | $SrRuO_3$ | $ZrO_2$ + 10 mol % $Y_2O_3$ |
| Substrate temperature (° C.) | 740 | 775 | 800 |
| Oxygen pressure (mbar) | 0.20 | 0.14 | $0.17 \times 10^{-2}$ |
| Laser pulse energy density ($J/cm^2$) | 3.4 | 1.7 | 1.7 |

Figure 2:
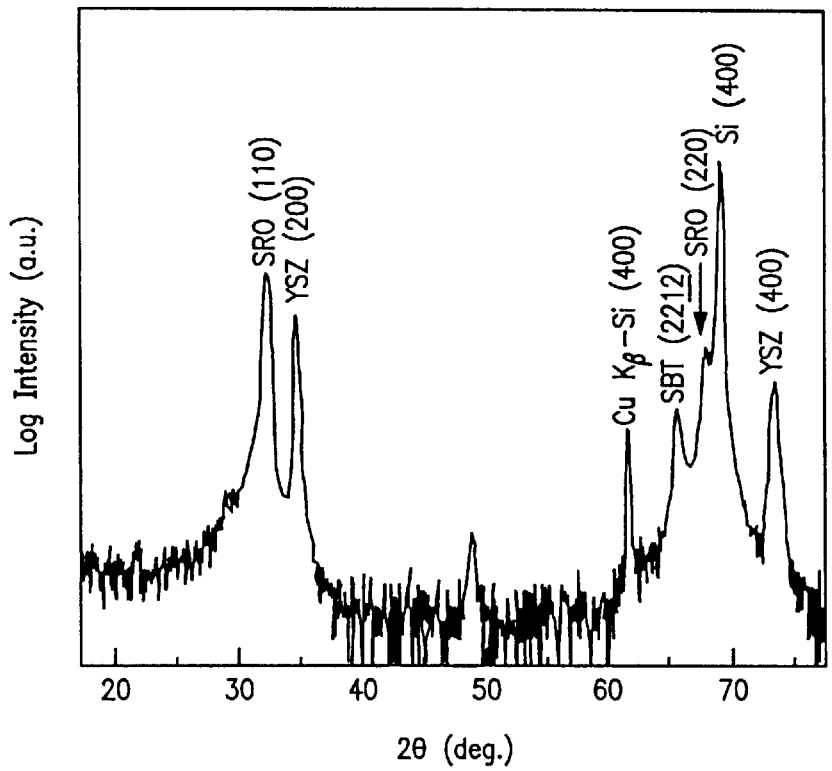
FIG. 2 is an X-ray diffraction pattern of an exemplary structure provided according to the present invention.
Figure 3:
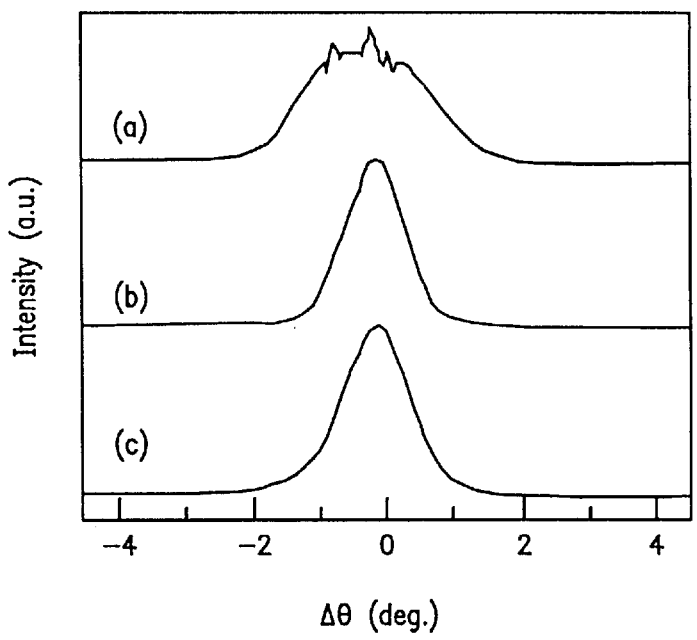
FIG. 3 illustrates rocking curve scans for various layers of the structure in FIG. 2.

Referring to the diffraction pattern on FIG. 2, the result of XRD $\theta$-$2\theta$ scan of a SBT/$SrRuO_3$/YSZ/Si structure is illustrated. FIG. 2 represents well-defined (116)-oriented SBT, (110)-oriented $SrRuO_3$, and (100)-oriented YSZ films. All of the Miller indices for the $SrRuO_3$ layer referred to in this example are based on the pseudo-cubic lattice parameter $a_c$=0.393 nm. For SBT, an orthorhombic unit cell was assumed: a=0.5531 nm, b=0.5534 nm, and c=2.498 nm. The epitaxial relationship between the thin films and substrate, based on the XRD $\theta$-$2\theta$ result, is SBT(116)||$SrRuO_3$(110) ||YSZ(100)||Si(100). Referring to the rocking curve $\theta$-scan of FIG. 3, the full-width at half maximum (FWHM) values of the SBT(2212), $SrRuO_3$(110), and YSZ(200) peaks are 1.7°, 0.96°, and 1.07°, respectively. These rocking curve $\theta$-scans suggest that YSZ is a good template layer for $SrRuO_3$ growth. One can also see an unidentified peak, labeled as (□) in FIG. 2, with low diffraction intensity of about 4% of that of the SBT(2212) at $2\theta$=49.05°. This unidentified peak belongs to a well-oriented plane, because the peak has a FWHM of $\Delta\theta$=2.2° in the rocking curve measurement.

Various pole figure analyses were conducted to confirm the crystallographic orientation and to determine whether the SBT/$SrRuO_3$/YSZ heterostructure is epitaxial. Referring to FIG. 4, X-ray pole figures of the SBT, $SrRuO_3$, and YSZ thin films are illustrated. The fixed $2\theta$ angles used to record the pole figures in FIG. 4 are 30.08°, 46.18°, 28.97°, and 25.13°, corresponding to the YSZ{111}(FIG. 4a), $SrRuO_3${200}(FIG. 4b), SBT{115} (FIG. 4c), and (FIG. 4d) planes, respectively. The pole figures were plotted with the pole distance angle $\psi$=0° (center) to $\psi$=90° (rim). In the case of SBT{113} in FIG. 4a, four diffraction peaks with a four-fold symmetry are observed as $\psi$=54.7°, showing that the YSZ(100) thin film has a very good in-plane orientation. The values of the tilt distribution of the YSZ(200) reflection and of the in-plane twist misalignment of the YSZ(111) reflections, measured by $\theta$-rocking curve and $\phi$-scan, were 1.07° and 1.13°, respectively. The resolution in $\Phi$-scan as measured on the Si(111) was 0.21°.

Figure 4A:
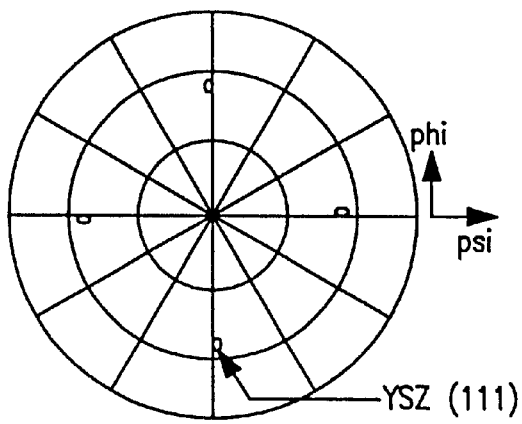
FIGS. 4a–4d are X-ray pole figures for various layers of the structure in FIG. 2.
Figure 4B:
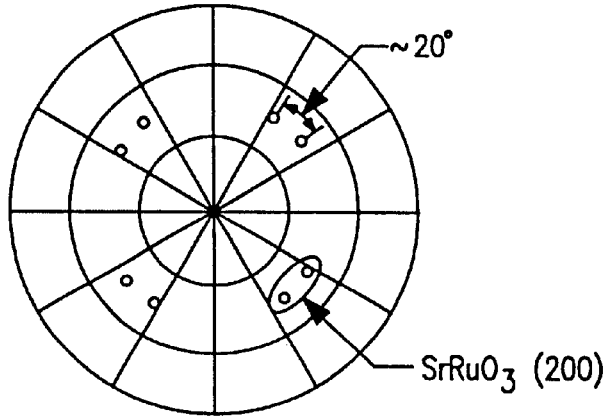
Figures 5A, 5B:
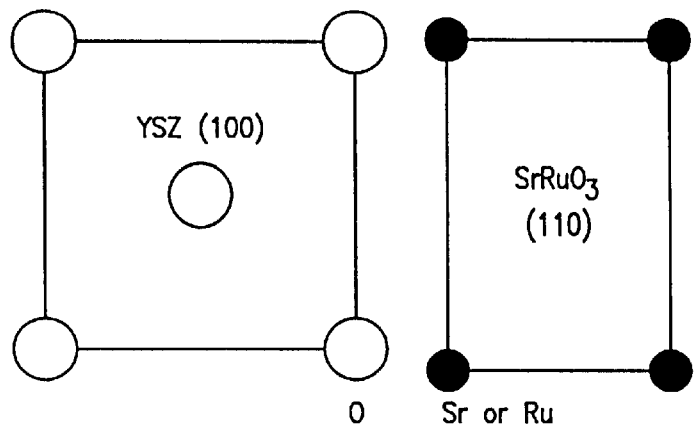
FIGS. 5a–5c are schematic diagrams illustrating the structures and epitaxial relationships of two of the layers of the structure in FIG. 2.
Figure 5C:
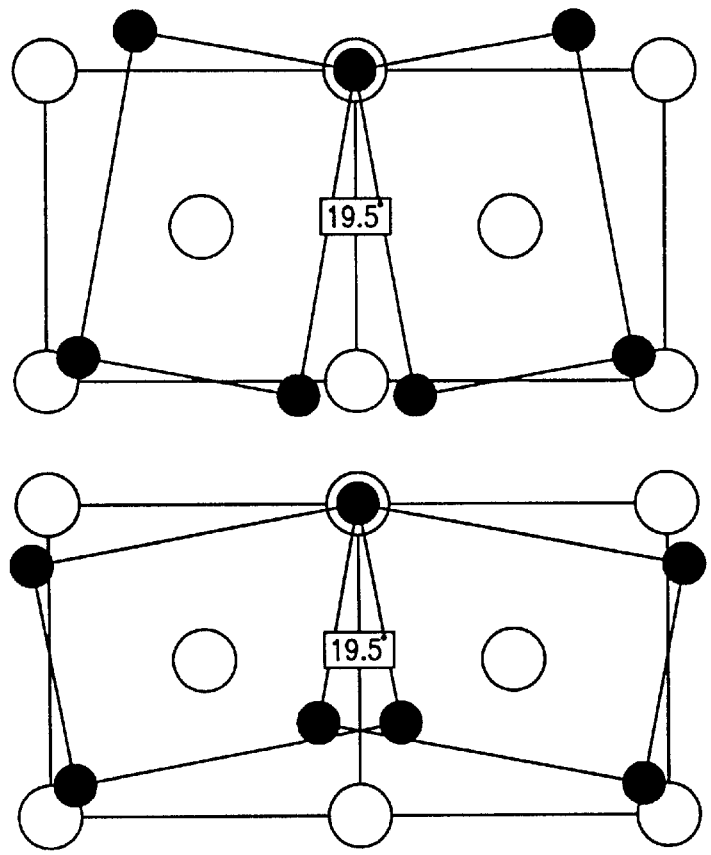

An apparent degeneracy with a four-fold symmetry (four-fold epitaxial positioning) of the $SrRuO_3$ thin film can be seen at $\psi$=45° in the pole figure of FIG. 4b. Each set shows two symmetric diffraction peaks with an offset $\Delta\phi$ of approximately 20°. The separation of the reflection peaks in the pole figure of FIG. 4b provides direct evidence for the specific in-plane-epitaxial growth pattern of $SrRuO_3$ on YSZ illustrated in FIG. 5. Domains of each of the four azimuthal orientation variants of the (110)-oriented SrRuO$_3$ in FIG. 5 are present in the SrRuO$_3$ thin film. These orientation variants result in the degeneracy of the pole figure (FIG. 4b), with the characteristic separation angle of 19.5°. This angle results From the azimuthal angle of 9.75° between the SrRuO$_3$ [001] and YSZ[010] directions, as indicated in FIG. 5. From this schematic diagram and the X-ray diffraction results, the epitaxial orientation relationship of the SrRuO$_3$ thin film on YSZ/Si(100) can be described as SrRuO$_3$(110) ||YSZ(100)||Si(100) and SrRuO$_3$[111]||YSZ[110]||Si[110] taking into account that the SrRuO$_3$[111] direction may be parallel to any of the four YSZ directions [110], [$\bar{1}$10], [1$\bar{1}$0], and [$\bar{1}\bar{1}$0]. However, despite the high intensity of the SrRuO$_3$ (110) diffraction peak in the θ-2θ scan of FIG. 2, relatively broad peaks with a FWHM of 2.94° were found in the φ-scan, which is comparably higher than that of the YSZ (111) with a value of 1.13°. Such a relatively broad distribution originates from the large lattice mismatch of −6.3% between the interplanar spacings of SrRuO$_3$(111) and YSZ (110). A similar growth trend of SrRuO$_3$(110) thin films on YSZ(100)/Si(100) substrates had been observed before, for example, in Hou et al., "Structure and properties of epitaxial Ba$_{0.5}$Sr$_{0.5}$TiO$_3$/SrRuO$_3$/ZrO$_2$ heterostructure on Si grown by off-axis sputtering," *Appl. Phys. Lett.* 67, 1387 (1995).

Figure 4C:
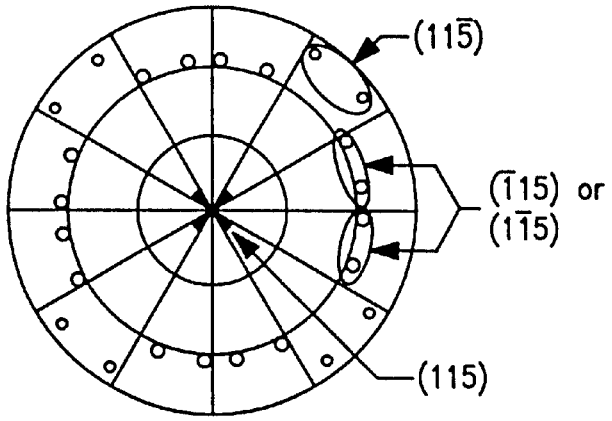
Figure 4D:
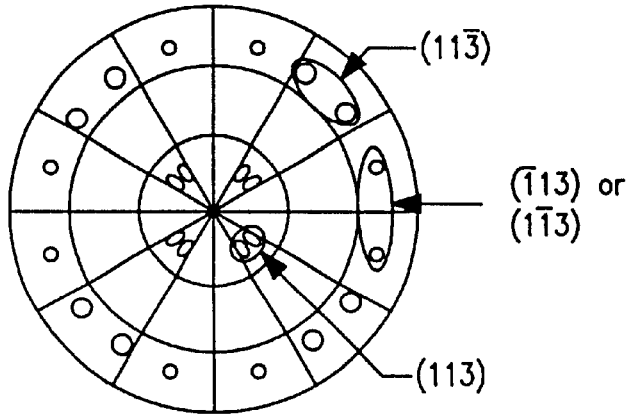

In order to analyze the in-plane orientation of the SBT thin film, two pole figure measurements were performed at 2θ=28.97° and 2θ=25.13° for the SBT{115} and {113} planes, respectively (FIGS. 4c and 4d). In FIG. 4c, the innermost four peaks centered at ψ=5.2° originate from the SBT(115) plane, which is the plane of the strongest diffraction intensity. From this pole figure, it is concluded that the SBT(116) plane is parallel to the substrate surface, because the angle between the (116) and (115) planes of SBT is 5.16°. Moreover, the diffraction peaks from ($\bar{1}$15) or (1$\bar{1}$5), and (11$\bar{5}$) are also present in FIG. 4c at ψ=65.1° and ψ=81.3°. Although a pole figure of {115} peaks is sufficient to identify the orientation, the sample was further examined by taking one more pole figure of SBT{113} to unambiguously confirm the epitaxial orientation as shown in FIG. 4d. In this figure, one can clearly observe the peaks from (113), (11$\bar{3}$), and ($\bar{1}$13) or (1$\bar{1}$3) at ψ=18.1°, 68.4°, and 73.1°, respectively. As expected from both the pole figure in FIG. 4b and the schematic drawing of a rectangle-on-cube epitaxy of SrRuO$_3$ in FIG. 5, all SBT peaks have a four-fold degeneracy having two symmetric peaks with an offset, Δφ, of approximately 20°. By referring to the pole figures, the epitaxial relationship between SBT and SrRuO$_3$ can be given as SBT(116)||SrRuO$_3$(110); SBT[110] SrRuO$_3$[001] (orthorhombic indexing of SBT). A similar epitaxial relationship between SBT(106) and the titanate SrTiO$_3$(110) has been reported as SBT[010]||SrTiO$_3$[001] (tetragonal indexing of SBT) in Nagahama et al., "Epitaxy of (106)-oriented SrBi$_2$Ta$_2$O$_9$ and SrBi$_2$Nb$_2$O$_9$ thin films," *Thin Solid Films* 353, 52 (1999). In this latter publication, however, the authors used a tetragonal indexing of SBT with a≈b≈0.39 nm.

In addition, ferroelectric hysteresis loops of the (116)-oriented SBT films on SrRuO$_3$ bottom electrodes on YSZ-buffered Si(100) have been recorded, giving a remanent polarization P$_r$=3.4 μC/cm$^2$ and a coercive filed E$_c$=71 kV/cm at a maximum applied electric field of 283 kV/cm.

It can therefore be seen from the description of the foregoing example that non-c-oriented epitaxial SBT thin films have been grown on Si substrates with SrRuO$_3$ and YSZ buffer layers. A rectangle-on-cube type of epitaxy between SrRuO$_3$ and YSZ revealed that SrRuO$_3$ and YSZ are good template layers including a bottom electrode for the growth of (116)-oriented SBT thin films on Si(100) substrates. The epitaxial relationship determined by X-ray diffraction is SBT(116)||SrRuO$_3$(110)||YSZ(100)||Si(100); SBT [110]||SrRuO$_3$[001] and SrRuO$_3$[111]||YSZ<110>||Si<110>.

As indicated hereinabove, anisotropic properties of bismuth-layered perovskites such as SBT and SBN have been studied by means of epitaxial thin films having different crystallographic orientations grown on single crystalline substrates such as SrTiO$_3$(STO), LaSrAlO$_4$, and MgO. SBT or SBN thin films having (001), (116), and (103) orientations have been grown, for example, on (001)-, (011)-, and (111)-oriented STO substrates, respectively, revealing that the three-dimensional epitaxial relationship SBT(001)|| (001); SBT[1$\bar{1}$0]||STO[100] is valid for all cases of SBT thin films on STO substrates, irrespective of their orientations. The (103)-oriented SBT films showed higher remanent polarization and dielectric constant than the (116)-oriented SBT films, since epitaxial (116)- and (103)-oriented SBT films have the direction of their spontaneous polarization lying 31° and 56° away from the film plane, respectively. Therefore, the (103)-oriented SBT (or SBN) films have a larger vertical polarization component normal to the film plane than the (116)-oriented SBT (or SBN) film. On the other hand, the c-axis-oriented SBT film revealed no ferroelectricity along the [001] axis. The reason for this electrical anisotropy is that the vector of the spontaneous polarization in SBT is directed perpendicularly to the c axis, specifically along the a axis. Although SBT films with (116) and (103) orientations on STO have been reported, these are still far from practical significance for memory devices, because those complex oxide crystals are not suitable as substrates in microelectronics. For a better compatibility with silicon-based microelectronics, epitaxial SBT films should be grown on silicon substrates. The ability to grow non-c-axis-oriented SBT films with a (116) orientation on Si(100) substrates has been demonstrated hereinabove.

In order to further increase the vertical component of the vector of the spontaneous polarization in SBT films, the epitaxial growth of (103)-oriented SBT films on buffered Si(100) substrates was investigated. Exemplary results of such films deposited by pulsed laser deposition (PLD) are given hereinbelow.

EXAMPLE 2

All films of SBT, SrRuO$_3$(SRO), MgO, and yttria-stabilized ZrO$_2$(YSZ) were deposited in situ by PLD, employing a KrF excimer laser (λ=248 nm) operating at a repetition rate of 5 Hz with an energy density of 2–4 J/cm$^2$. The base pressure in the chamber was 5×10$^{-8}$ mbar before raising the substrate temperature. p-Si(100) substrates were silver pasted on a stainless steel substrate holder, which was placed parallel to the target at a distance of 6 cm. The target was rotated at about 0.2 Hz during the deposition. The substrate temperature was measured with a K-type thermocouple positioned in the middle of the substrate holder. The epitaxial 50 nm-thick YSZ, 25 nm-thick MgO, 50 nm-thick SRO, and 250 nm-thick SBT thin films were deposited on Si(100) substrates at substrate temperatures of 800° C. (YSZ and MgO), 775° C. (SRO), and 740° C. (SBT) in flowing O$_2$ pressures of 1.7×10$^{-3}$ mbar (YSZ and MgO), 0.14 mbar (SRO), and 0.4 mbar (SBT), respectively. For the electrical characterization, Pt top electrodes with an area of 1.1×10$^{-3}$ cm$^2$ were deposited by rf-sputtering at room temperature. After top electrode deposition, the samples were annealed at 450° C. for 30 min in an oxygen atmosphere to stabilize the contact between SBT and Pt. The heterostructures were structurally characterized by x-ray diffraction (XRD) θ-2θ and φ scans using a Philips X'PERT MRD™ four-circle diffractometer. The polarization versus electric field (P-E) hysteresis loops of (103)-oriented SBT films were recorded by a TF ANALYZER 2000™ ferroelectric tester (AixACCT) at 100 Hz.

Figure 6A:
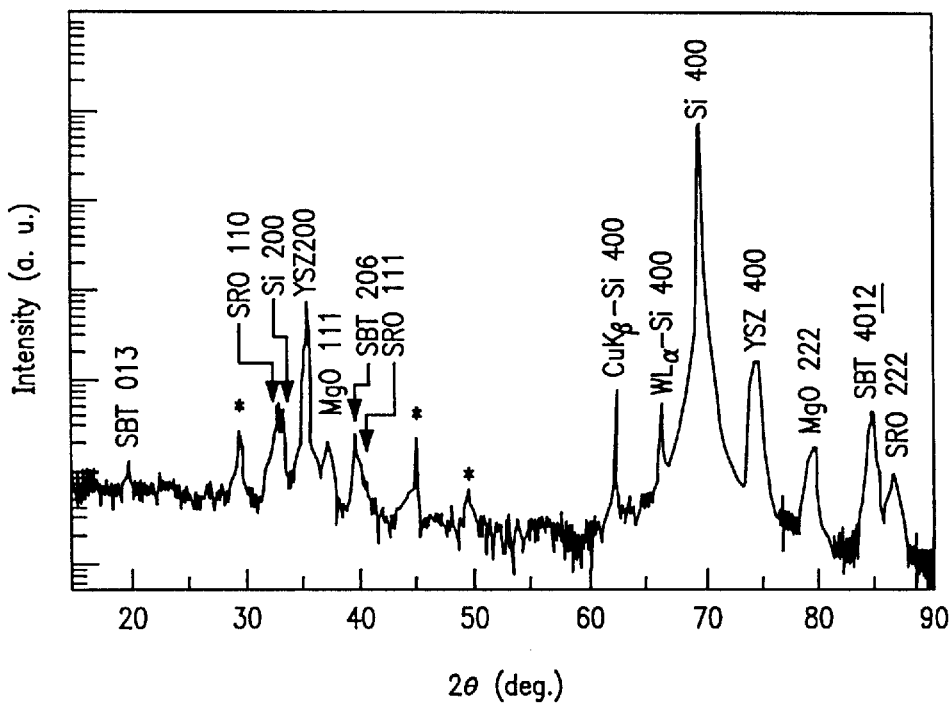
FIGS. 6a and 6b are X-ray diffraction scans of another exemplary structure provided according to the present invention.

FIG. 6a shows the result of an XRD θ-2θ scan of a SBT/SRO/MgO/YSZ/Si(100) structure. The figure displays x-ray spectra for (103)-oriented SBT, (111)-oriented SRO, (111)-oriented MgO, and (100)-oriented YSZ films, although there is a small contribution of SRO(110) domains and of impurity phases labeled as (*), most probably other Sr—Bi—Ta—O compounds, for instance pyrochlore- or fluorite-like phases. All the Miller indices for SBT and SRO referred to in this example are based on orthorhombic (a=0.5531 nm, b=0.5534 nm, and c=2.4984 nm) SBT and pseudocubic ($a_c$=0.3928 nm) SRO lattice parameters, respectively. The orientation relationship between the thin films and the substrate, based on the XRD θ-2θ result, is SBT(103)||SRO(111)||MgO(111)||YSZ(100)||Si(100). The full width at half maximum values of rocking curves of the SBT 4012, SRO 111, MgO 111, and YSZ 200 reflections are 2.2°, 1.9°, 1.5°, and 1.1°, respectively.

Figure 6B:
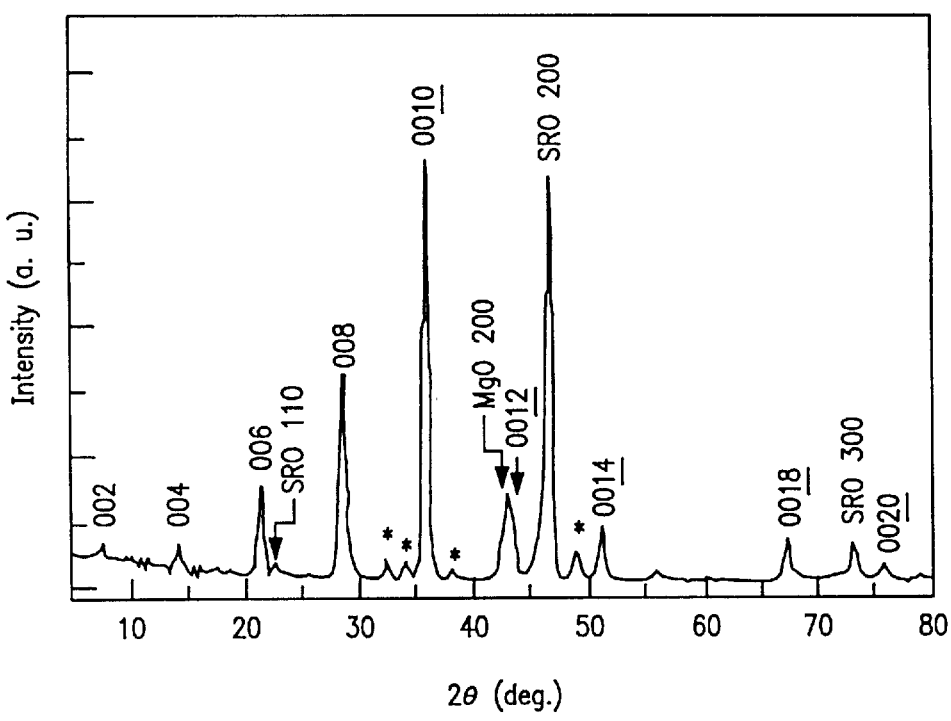

Another XRD θ-2θ scan optimized for the SBT 0010 reflection, taken at ψ=55.1°, revealed well-defined SBT (103) and SRO(111) orientations as shown in FIG. 6b (ψ=90° corresponds to the substrate surface being parallel to the plane defined by the incident and reflected x-ray beams). SBT 001 and SRO h00 peaks are clearly seen revealing that SBT(001)||SRO(100), which means that SBT(103)||SRO (111), because the calculated tilt angles between the corresponding two planes of SBT and SRO are ∠SBT(103):SBT (001)=56.4° and ∠SRO(111):SRO(100)=54.7°, respectively (the ψ angle used to record the θ-2θ scan was 55.1°). The unidentified peaks labeled as (*) might be related with the impurity phases mentioned earlier.

In order to determine whether the SBT/SRO/MgO/YSZ/Si heterostructure is epitaxial and to confirm the crystallographic orientation, various φ scans were conducted. FIG. 7 shows φ scans of (a) Si 111, (b) YSZ 111, (c) MgO 200, (d) SRO 200, and (e) SBT 113 reflections. The reflections were recorded at fixed ψ angles of 39.8° for the SBT film and 54.7° for the other films. As discussed hereinabove, a YSZ(100) film shows a four-fold growth symmetry on Si(100) substrates revealing a cube-on-cube epitaxy relationship as shown in FIGS. 7a and 7b.

Figure 7D:
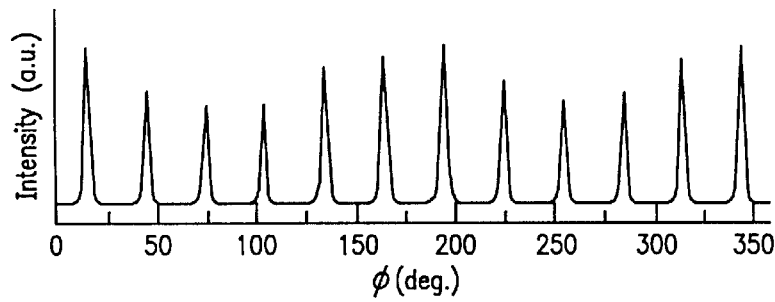
Figure 7C:
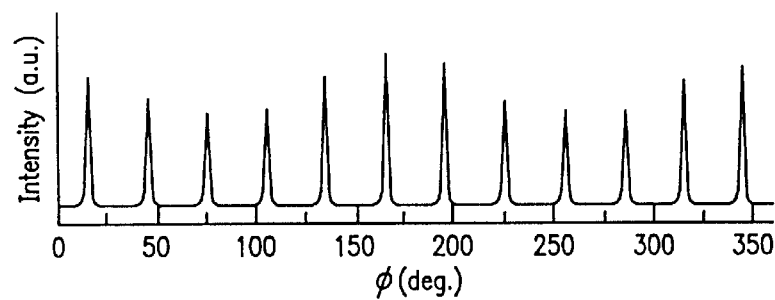
Figures 8A, 8B, 8C, 8D:
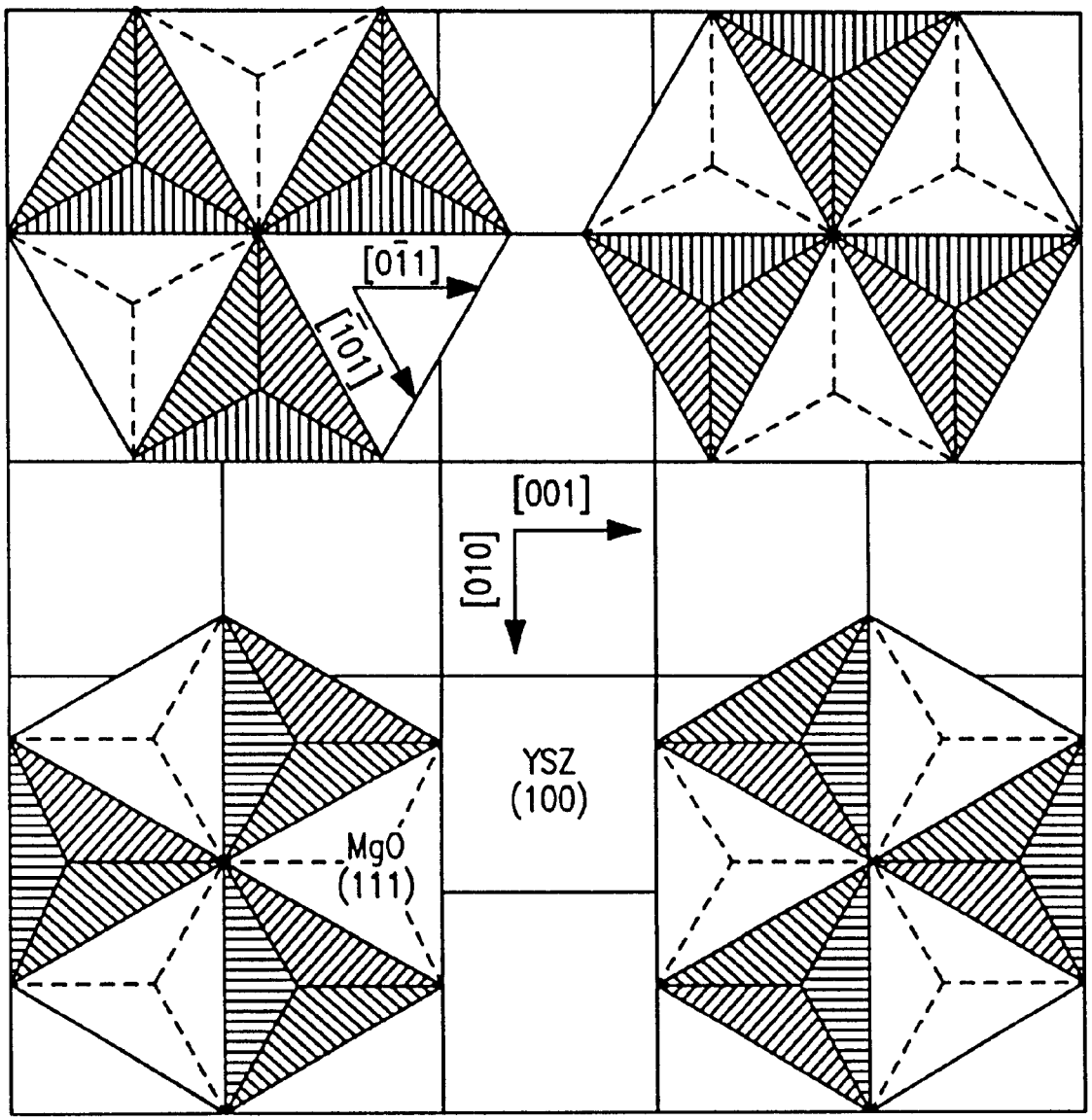
FIGS. 8a–8d are schematic diagrams illustrating cystallographic relationships in the structure in FIGS. 6a and 6b rotated in-plane by 0°, 90°, −90°, and 180° around the normal to substrate surface, respectively.

The epitaxial orientation relationship between the MgO film and the YSZ film does not follow the MgO(100)||YSZ (100) relationship nor the MgO(110)||YSZ(100) relationship, although the latter had been reported before. In a φ scan of the MgO 200 reflection (FIG. 7c), twelve peaks were recorded. These peaks correspond to a three-fold symmetry with four different positions of MgO(111) domains on the YSZ(100) film. The twelve symmetric peaks in the φ scan of FIG. 7c provide reliable evidence for the specific in-plane-epitaxial growth pattern of the MgO(111) film on the YSZ(100) film illustrated in FIG. 8. In FIG. 8, four types of azimuthally rotated domains (rotated in-plane by 0°, 90°, -90°, and 180° around the normal to the substrate surface) are schematically sketched. The four orientation variants result in the twelve φ scan peaks FIG. 7c, with a characteristic separation angle of 30° between the neighboring peaks. From these XRD results and the schematic drawing, the epitaxial orientation relationship between MgO (111) and YSZ(100) films is determined as MgO(111)||YSZ (100); MgO[0$\bar{1}$1]||YSZ(001), taking into account that the MgO[0$\bar{1}$1] direction may be parallel to any of the four YSZ directions [010], [0$\bar{1}$1], [001], and [00$\bar{1}$]. The misfit value ($d_{film}$-$d_{sub}$)/$d_{sub}$ along the MgO[$\bar{2}$11]||YSZ[010] direction was calculated from $d_{film}$=d($\bar{2}$11)MgO and $d_{sub}$=d(010)YSZ as approximately 0.4%. That along the MgO[0$\bar{1}$1]||YSZ[001] direction amounts to approximately 15.9%. A similar growth trend of MgO(111) thin films on YSZ(100)/Si(100) substrates has been observed before. See, e.g., P. A. Stampe and R. J. Kennedy, "X-ray characterization of MgO thin films grown by laser ablation on yttria-stabilized zirconia," *Journal of Crystal Growth*, 191, 472 (1998). From the φ scan of the SRO 200 reflection at ψ=45° shown in FIG. 7d, an epitaxial growth was revealed for the SRO(111) film on the MgO(111) film, with the corresponding epitaxial relationship SRO(111)|| MgO(111); SRO[0$\bar{1}$1]||MgO[0$\bar{1}$1]. The SRO film also consists of four azimuthal domains, which are directly "replicated" from the four azimuthal domains of the MgO film. The lattice misfit along the [001]SRO||[001]MgO direction is about -6.7%. In FIG. 7d, there is a small contribution originating from a shoulder of the SBT 206 peak, since the fixed angles of 2θ=46.18° and ψ=54.7° to record the φ scan using the SRO 200 reflection are close to the angles 2θ and ψ of the SBT 110 reflection in the (103)-oriented SBT film, at ψ=53.9°.

Figure 7E:
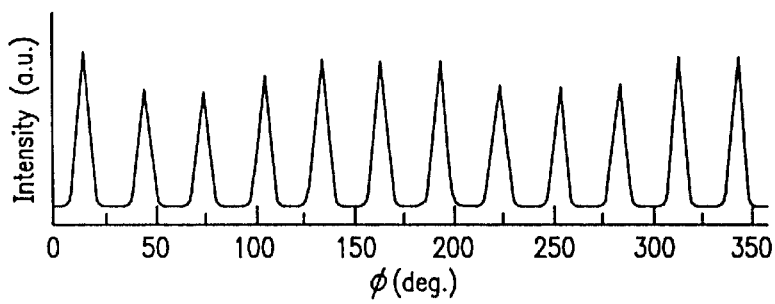
FIGS. 7a–7e illustrate diffraction scans through different layers of the structure in FIGS. 6a and 6b.
Figure 7B:
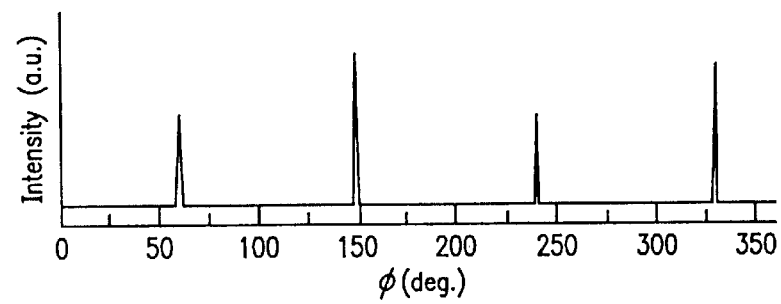
Figure 7A:
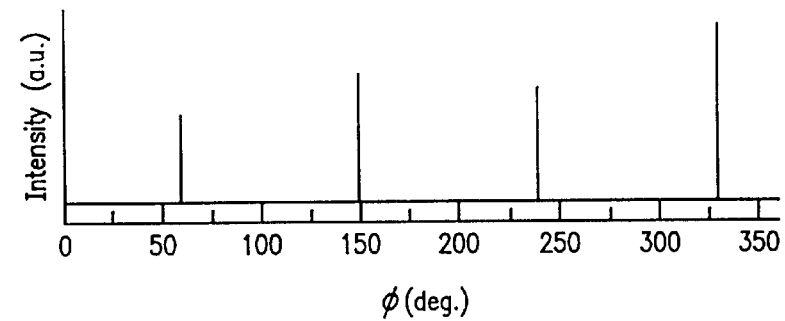

A triple-domain positioning of the SBT film on each of the four azimuthal domains of the SRO film was revealed for the (103)-oriented SBT film on the SRO/MgO/YSZ/Si heterostructure, as shown in FIG. 7e. The (103)-oriented SBT film growing on these four azimuthal domains of the (111)-oriented SRO film turns out to consist of twelve corresponding azimuthal domains (or multiple twins). The epitaxial relationships between the films and the substrate, based on all the XRD results, are SBT(103)||SRO(111)||MgO (111)||YSZ(100)||Si(100); SBT[010]||SRO[0$\bar{1}$1]||MgO[0$\bar{1}$1]||YSZ(001)||Si (001).

Figure 9:
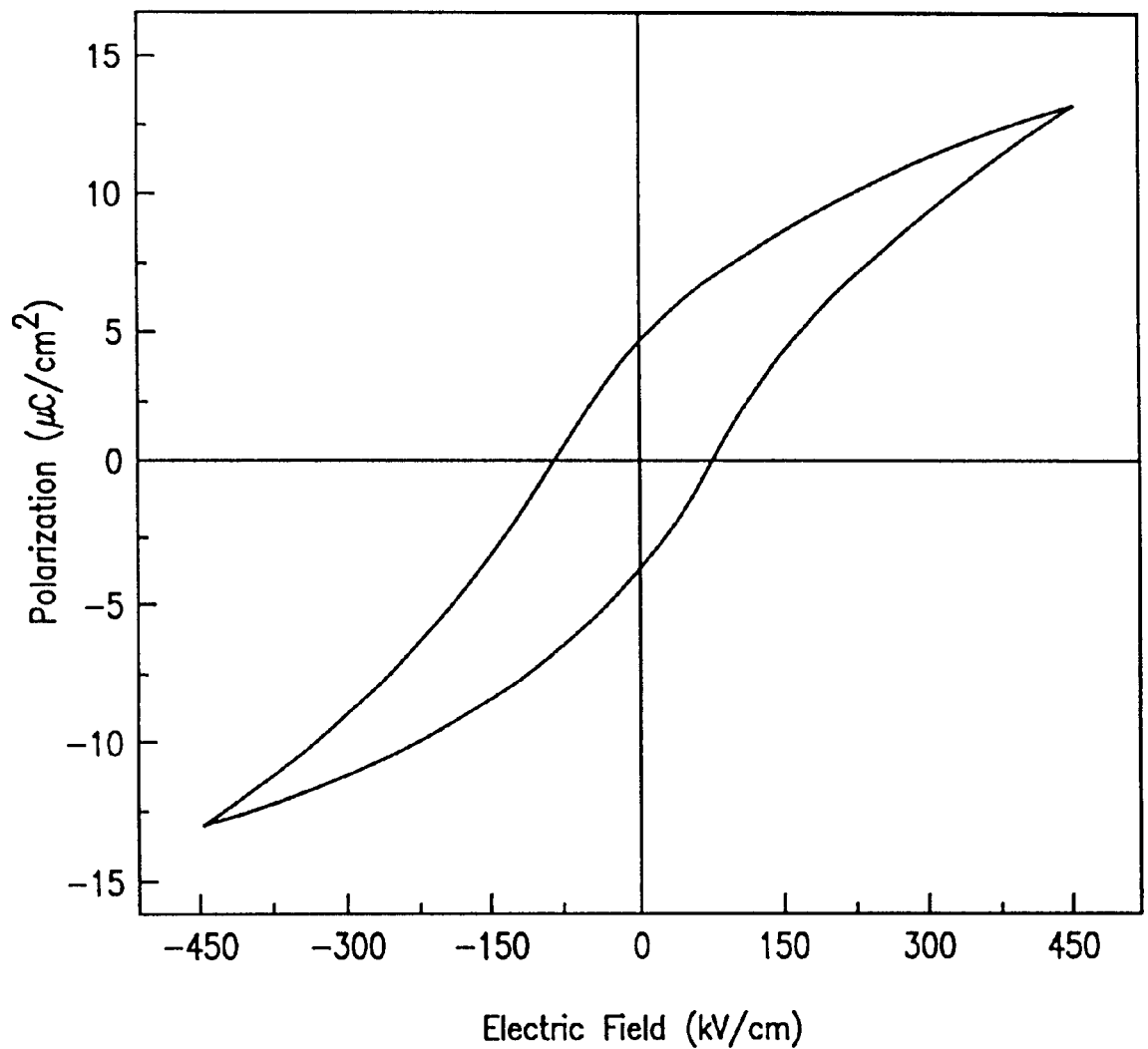
FIG. 9 is a ferroelectric hysteresis loop describing behavior of the structure in FIGS. 6a and 6b.

FIG. 9 shows a ferroelectric hysteresis loop revealing a remanent polarization ($P_r$) of 5.2 μC/cm$^2$ and a coercive field ($E_c$) of 76 kV/cm for a maximum applied electric field of 440 kV/cm. By comparing the $P_r$ value with that of a (116)-oriented SBT film on a buffered Si(100) substrate ($P_r$<4 μC/cm$^2$), it is concluded that the growth of non-c-axis-oriented SBT films, which have the direction of the spontaneous polarization closer to the film normal, is advantageous for the application of these films as a capacitor material to planar-type ferroelectric random access memories. However, the overall value of $P_r$ is lower than the reported values for SBT films grown epitaxially on STO substrates as well as for SBN films on STO. This might be a result of a worse crystallinity (presence of impurity phases) and/or the presence of multiple twins in the SBT films on buffered-Si substrates.

Figure 10:
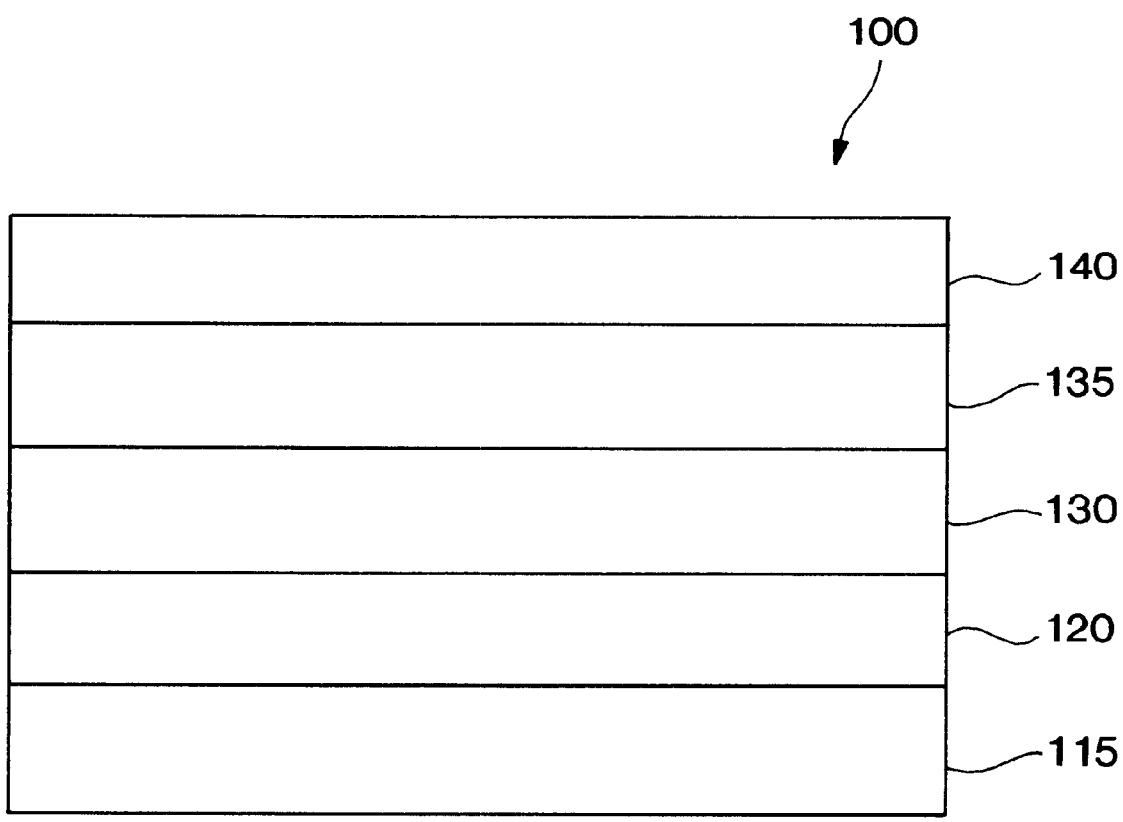
FIG. 10 is a simplified cross-sectional view of the basic layers of a structure comprising an a-axis-oriented ferroelectric material in accordance with the present invention.

Referring now to FIG. 10, there is illustrated another heterostructure, generally designated 100, that contains a non-c-axis-oriented, bismuth-layered perovskite ferroelectric film epitaxially grown on a buffered substrate in accordance with a fifth embodiment of the present invention. Heterostructure 100 comprises a wafer or substrate 115 having a (100) orientation. Preferably, substrate 115 comprises a semiconducting material such as Si (100). Other substrates include, by way of example, those materials having lattice parameters similar to the lattice parameter of silicon (0.5431 nm), such as Ge (100) and GaAs (100) whose lattice parameters are 0.5657 nm and 0.5653 nm, respectively. A (100)-oriented buffer layer 120 such as YSZ is deposited on substrate 115. A template layer 130 comprising a non-c-axis-oriented, electrically conductive, oxide-containing material is deposited on buffer layer 20. As in the previously described embodiments, the composition and structure of template layer 130 are such that template layer 130 provides a template suitable for enabling the epitaxial growth of a layer of non-c-axis-oriented, anisotropic ferroelectric material 135 preferably exhibiting a bismuth-containing perovskite structure. Preferably, template layer 130 is a cubic or pseudo-cubic perovskite metal oxide. Non-limiting examples of suitable template layers 130 include $SrRuO_3$ and $LaNiO_3$. For the purpose of fabricating a device that benefits from the use and properties of ferroelectric layer 135, an electrically conductive layer 140 such as an electrode or a contact can be disposed on ferroelectric layer 135. Template layer 130 can thus serve as a bottom electrode for ferroelectric layer 135. As indicated previously, various deposition methods understood by persons skilled in the art can be employed in forming the layers of heterostructure 100, and the present invention is not limited to the use of any particular deposition or material transport technique.

The fifth embodiment illustrated in FIG. 10 differs from the previously described embodiments primarily in that ferroelectric material 135 comprises SBT or $Bi_4Ti_3O_{12}$ (which can be La-doped, i.e., BLT) having an a-axis orientation, or (100) orientation. In the previously described embodiments, the non-c-axis orientations involve the vector of spontaneous polarization being inclined to the film plane (e.g., approximately 45°±3° in the case of 116- and 118-orientations, and approximately 55°±3° in the case of 103- and 104-orientations). For heterostructure 100, however, the a-axis or (100) orientation of ferroelectric material 135 involves the vector of spontaneous polarization being exactly perpendicular to the film plane (90°) in the case of SBT, and almost perpendicular to the film plane in the case of BLT. In consideration of applications of the present invention as well as physics and crystallography in general, the a-axis orientation is the best case that can be obtained. The a-axis orientation is superior to the other non-c-axis orientations described hereinabove, because now the full polarization vector in the case of SBT, and almost the full polarization vector in the case of BLT, is perpendicular to the film plane.

As in the previous embodiments, ferroelectric material 135 is preferably grown by depositing films using the PLD technique (although other deposition/transport/growth techniques could also be suitable), and by using specific buffer and electrode layers of well-defined crystallographic orientations. The a-axis orientation has been successfully realized according to the invention through the discovery and development of at least three primary concepts. First, as in the case of (118)-oriented BLT films, a (110)-oriented template or electrode layer 130 is utilized, which preferably is composed of $SrRuO_3$ or $LaNiO_3$. However, the thickness of this (110)-oriented electrode layer 130 has now been purposely chosen to be very thin, e.g., from approximately 10 to approximately 15 nm. In this manner, the very thin electrode layer 130, striving for a good adaptation to the underlying buffer layer 120, becomes somewhat stretched, so that the lattice parameter of electrode layer 130 is somewhat larger than usual. This makes electrode layer 130 a better template for (100)-oriented nuclei than for (118)-oriented nuclei, thereby shifting the competition between them in favor of the (100) orientation.

Second, after many nuclei of the (100) orientation and few nuclei of the competing (118) orientation have formed on the stretched (110)-oriented electrode layer 130, means are taken to favor the further growth of the many (100)-oriented BLT nuclei and to suppress the further growth of the few (118)-oriented nuclei. This is accomplished by choosing a high deposition rate. Acceptable ranges of deposition rates are from approximately 1 to approximately 10 nm/min for template layer 130, and from approximately 100 to approximately 200 nm/min for ferroelectric layer 135.

Third, a high oxygen pressure is used during deposition to prevent bismuth and/or bismuth oxide re-evaporation from the growing film. For crystallographic reasons, a higher re-evaporation occurs from (100)-oriented regions than from (118)-oriented regions. The high oxygen pressure (e.g., approximately 0.9 mbar to approximately 5 mbar) suppresses this effect.

By applying these ideas, an amount of as much as 99% of the (100)-orientation and only 1% of the (118)-orientation has been achieved in experiments. The superior ferroelectric properties of these films (e.g., a remanent polarization of 32 $\mu C/cm^2$) have been demonstrated.

As in the case of heterostructure 10, heterostructure 100 can be used in a ferroelectric thin-film capacitor or other device for random access memory (RAM) applications, such as dynamic random access memory (DRAM). As one example, a ferroelectric capacitor is provided in which ferroelectric layer 135 is sandwiched between conductive layer 140, such as a metal or conductive oxide electrode, and template layer 130 serving as a bottom electrode.

In the following, more specific, epitaxially a-axis-oriented, La-substituted $Bi_4Ti_3O_{12}$ (BLT) thin films having the major spontaneous polarization entirely along the film normal, and a remanent polarization of 32 $\mu C/cm^2$, were grown by pulsed laser deposition on yttria-stabilized zirconia-buffered Si(100) substrates covered with very thin $SrRuO_3$ bottom electrodes. In addition to the strained $SrRuO_3$ layer, suppression of bismuth re-evaporation during deposition was achieved by employing a relatively high growth rate and a high oxygen pressure.

EXAMPLE 3

BLT films and $SrRuO_3$ and YSZ layers were grown in situ by PLD on Si(100) substrates, employing a KrF excimer laser ($\lambda$=248 nm). The deposition conditions for $SrRuO_3$ (10~50 nm in thickness) and YSZ (60 nm) and other details have been reported in Lee et al., "Epitaxial growth of non-c-oriented ferroelectric $SrBi_2Ta_2O_9$ thin films on Si(100) substrates," *Appl. Phys.*, A71, 101 (2000); Lee et al., "Growth and characterization of non-c-oriented epitaxial ferroelectric $SrBi_2Ta_2O_9$ films on buffered Si(100)," *Appl. Phys. Lett.*, 77, 3260 (2000). For BLT deposition, a bismuth-excess $Bi_{3.75}La_{0.75}Ti_3O_{12}$ target was used, and substrate temperature (650~825° C.), laser fluence (1.7~4.0 J/cm²), laser repetition rate (2~10 Hz), and oxygen pressure (30~100 Pa) were systematically varied while the number of laser pulses was fixed to 3000. These parameters were important in determining the orientation and quality of the BLT films. Since two competing orientations, (100) and (118), occurred in the BLT films, the volume fractions of the (100) and (118) orientations, respectively, were evaluated by comparing the corresponding x-ray diffraction (XRD) intensities in $\phi$ scans. The latter were recorded using the BLT 111 reflection, giving peaks at $\psi$=46° and 36° in correspondence to the (100) and (118) orientations, respectively ($\psi$=90° corresponds to the substrate surface being parallel to the plane defined by the incident and reflected x-ray beams).

TABLE 2, set forth hereinbelow, summarizes the substrates and deposition conditions utilized in this Example for the BLT deposition, as well as the BLT film quality obtained. The rows of data correspond to the samples shown in FIGS. 11A–11I, respectively. The FWHM values were recorded using the BLT 200/020 peak in $\omega$ scans. The values for $\alpha_{(100)}$ were calculated by recording the XRD intensity in φ scans of the 111 reflection.

different temperatures onto YSZ(100) single crystal substrates covered with a 50-nm thick (110)-oriented $SrRuO_3$

TABLE 2

Substrates and Deposition Conditions For BLT Deposition

| Samples in FIG. 11 | Substrate thickness of $SrRuO_3$ (nm) | Substrate/ temperature (° C.) | Laser fluence (J/cm$^2$) | Laser repetition rate (Hz) | Oxygen pressure (Pa) | ω-FWHM (°) | $α_{(100)}$ (%) |
|---|---|---|---|---|---|---|---|
| A | YSZ/50 | 650 | 2.3 | 5 | 40 | 1.69 | 4 |
| B | YSZ/50 | 765 | 2.3 | 5 | 40 | 1.03 | 46 |
| C | YSZ/10 | 765 | 2.3 | 5 | 40 | 0.63 | 78 |
| D | Si/10 | 765 | 1.7 | 5 | 40 | 1.32 | 48 |
| E | Si/10 | 765 | 3.4 | 5 | 40 | 1.20 | 65 |
| F | Si/10 | 765 | 3.4 | 2 | 40 | 1.37 | 41 |
| G | Si/10 | 765 | 3.4 | 7 | 40 | 1.09 | 76 |
| H | Si/10 | 765 | 3.4 | 7 | 30 | 1.35 | 53 |
| I | Si/10 | 765 | 3.4 | 7 | 100 | 0.83 | 99 |

The AFM topography images FIGS. 11A–11I each have an image area of 5×5 $μm^2$. FIGS. 11A–11C are images of BLT films grown on $SrRuO_3$(110)/YSZ(100) substrates, and FIGS. 11D–11I are images of BLT films grown on $SrRuO_3$(100)/YSZ(100)/Si(100) substrates. As previously noted, the deposition conditions are summarized in TABLE 1 hereinabove. The AFM images were selected from a large number of images to illustrate the influence of (i) substrate temperature T; (ii) $SrRuO_3$ layer thickness d (sample A: T=650° C., d=50 nm; sample B: T=765° C., d=50 nm; sample C: T=765° C., d=10 nm); (iii) laser fluence (sample D: 1.7 J/cm$^2$; sample E: 3.4 J/cm$^2$); (iv) laser repetition rate (sample F: 2 Hz; sample G: 7 Hz); and (v) oxygen pressure (sample H: 30 Pa; sample I: 100 Pa).

Figure 12:
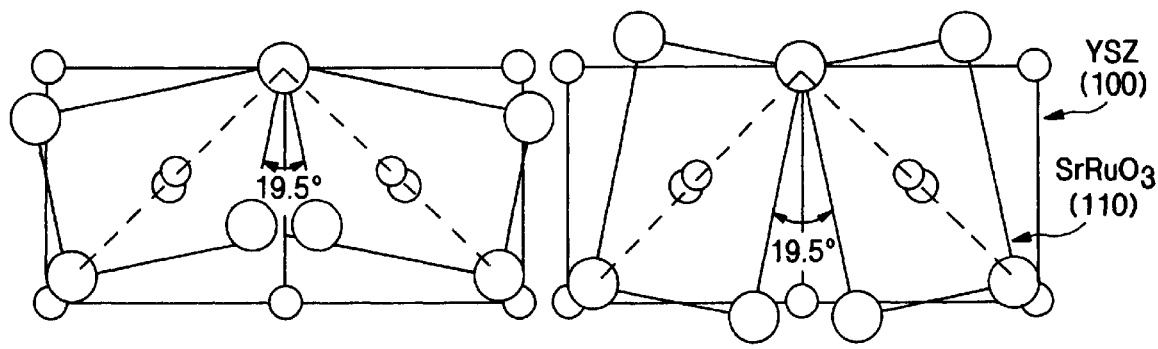
FIG. 12 is a schematic diagram of the diagonal-type rectangle-on-cube epitaxy of $SrRuO_3$ (110) on YSZ (100) with four variants of $SrRuO_3$ on YSZ showing the origin of the approximately 20° azimuthal rotation.

While the exact value of the volume fraction $α_{(100)}$ of the (100)-oriented part of the BLT film was determined by XRD φ scans, it could already be roughly estimated from the morphology of the grains visible in atomic force microscopy (AFM) topography images disclosed herein as FIGS. 11A–11I. There are two distinct shapes of grains, long needle-like ones and more or less equiaxed ones. The long grains correspond to the (118)-oriented part of the film, whereas the equiaxed grains represent the (100)-oriented part of the film. The long edge of the (118)-oriented part of the film is parallel to the BLT [110] direction, due to the high growth rate of bismuth-layered perovskite materials along the [110] direction. In addition, the needle-like (118)-oriented BLT grains occur with four different azimuthal orientations, as can be seen in most of the images of FIG. 11, and particularly in FIG. 11A. This phenomenon has been described and explained in detail for (116)-oriented SBT grains on buffered Si(100) substrates in Lee et al., "Epitaxial growth of non-c-oriented ferroelectric $SrBi_2Ta_2O_9$ thin films on Si(100) substrates," *Appl. Phys.*, A71, 101 (2000); Lee et al., "Growth and characterization of non-c-oriented epitaxial ferroelectric $SrBi_2Ta_2O_9$ films on buffered Si(100)," *Appl. Phys. Lett.* 77, 3260 (2000). The phenomenon stems from the four possible azimuthal orientations of the $SrRuO_3$ grains in (110)-oriented $SrRuO_3$ layers on (100)-oriented YSZ buffer layers, as shown in the epitaxial schematic diagram of FIG. 12. The phenomenon results in pairwise azimuthal difference angles of 19.5° between two differently oriented $SrRuO_3$ grains, as shown in FIG. 12. As a consequence, corresponding azimuthal difference angles of 19.5° also occur between the needle-like (118)-oriented BLT grains growing on top of the $SrRuO_3$ grains.

The optimum substrate temperature for (100)-oriented growth of BLT was found by depositing BLT films at different temperatures onto YSZ(100) single crystal substrates covered with a 50-nm thick (110)-oriented $SrRuO_3$ layer, and determining the volume fraction $α_{(100)}$. Varying the substrate temperature from 650° C. to 825° C. with temperature steps of 5 or 10 K, it was found that $α_{(100)}$ was as low as 4% at 650° C. (FIG. 11A) and reached its maximum of 46% at 765° C. (FIG. 11B). A further increase of $α_{(100)}$ was possible by reducing the thickness of the (110)-oriented $SrRuO_3$ electrode layer.

FIG. 11C shows an image taken from a BLT film grown on a very thin (10 nm) $SrRuO_3$ film, otherwise using the same deposition conditions as in FIG. 11B. Replacing the 50-nm thick $SrRuO_3$ layer by a 10-nm thin layer results in an additional increase of $α_{(100)}$ from 46% (FIG. 11B) to 78% (FIG. 11C). This drastic effect is most probably due to the thin $SrRuO_3$ layer being strained due to the influence of the lattice mismatch of −6.3% between $SrRuO_3$ (a=3.93 nm) and YSZ (a=5.14 nm) along the direction $SrRuO_3$[$\bar{1}$11]∥YSZ[011]. This strain results in an increased $SrRuO_3$ lattice parameter which reduces the BLT/$SrRuO_3$ lattice misfit of nominally +4.6% along the direction BLT[001] ∥$SrRuO_3$[001], providing better nucleation conditions for (100)-oriented BLT grains compared with (118)-oriented grains. The same effect was observed for BLT films grown on YSZ-buffered Si(100) substrates. Here, the use of a (110)-oriented $SrRuO_3$ electrode layer of a reduced thickness of 10 nm resulted in a value of $α_{(100)}$=56% at the (same) optimum substrate temperature of 765° C.

A further increase of $α_{(100)}$ was achieved by a systematic variation of the other deposition conditions, as set forth in TABLE 2 hereinabove. As illustrated by FIGS. 11D–11I, laser fluence (FIGS. 11D and 11E), laser repetition rate (FIGS. 11F and 11G), and oxygen pressure (FIGS. 11H and 11I) all have a considerable influence on the value of $α_{(100)}$. In order to maximize the volume fraction of the a-axis orientation, it was necessary to deposit the films at high laser fluence, repetition rate, and oxygen pressure as summarized in TABLE 2. A maximum volume fraction of the (100) orientation of $α_{(100)}$=99% was attained at the following optimal conditions: substrate temperature 765° C.; laser fluence 3.4 J/cm$^2$; laser repetition rate 7 Hz; and oxygen pressure 100 Pa. The optimal conditions correspond to the image of FIG. 11I.

These optimal deposition conditions for PLD-grown a-axis-oriented BLT films are much different from those of PLD-grown bismuth-layered perovskite films of c-axis orientation or of other non-c-axis orientations. For example, high-quality c-axis-oriented SBT films are grown at a much lower oxygen pressure (20 Pa, $O_2/O_3$ mix) and laser repetition rate (4 Hz) than the a-axis-oriented BLT films disclosed herein. See Lettieri et al., "Optimization of the growth of epitaxial $SrBi_2Ta_2O_9$ thin films by pulsed laser deposition," *Thin Solid Films* 379, 64 (2000). Similarly, (118)-, (104)-, and c-axis-oriented BLT films (having their respective c-axes tilted 45°, 55°, and 0° away from the normal to the film plane) are grown at comparatively low values of substrate temperature (600–700° C.), oxygen pressure (40 Pa), laser fluence (2.3 J/cm$^2$) and laser repetition rate (5 Hz). While the very low thickness of the $SrRuO_3$ electrode most probably 3w facilitates the nucleation of a-axis-oriented BLT regions via a low BLT(100)/$SrRuO_3$(110) lattice misfit due to a strained $SrRuO_3$ lattice, the high values of oxygen pressure and laser repetition rate necessary to grow a-axis-oriented BLT films can most likely be explained in terms of preventing an extensive bismuth or bismuth oxide re-evaporation at the rather high substrate temperature required. It is considered that in a-axis-oriented BLT films, the $Bi_2O_2$ layers are perpendicular to the film plane, bluntly ending on the growth surface of the film. Most probably evaporation of bismuth and/or bismuth oxide is facilitated by this fact. On the contrary, c-axis-oriented bismuth-layered films have their $Bi_2O_2$ layers parallel to the film plane, sandwiched between perovskite blocks, which certainly hinders or even prevents extensive re-evaporation of bismuth and/or bismuth oxide.

Figure 13:
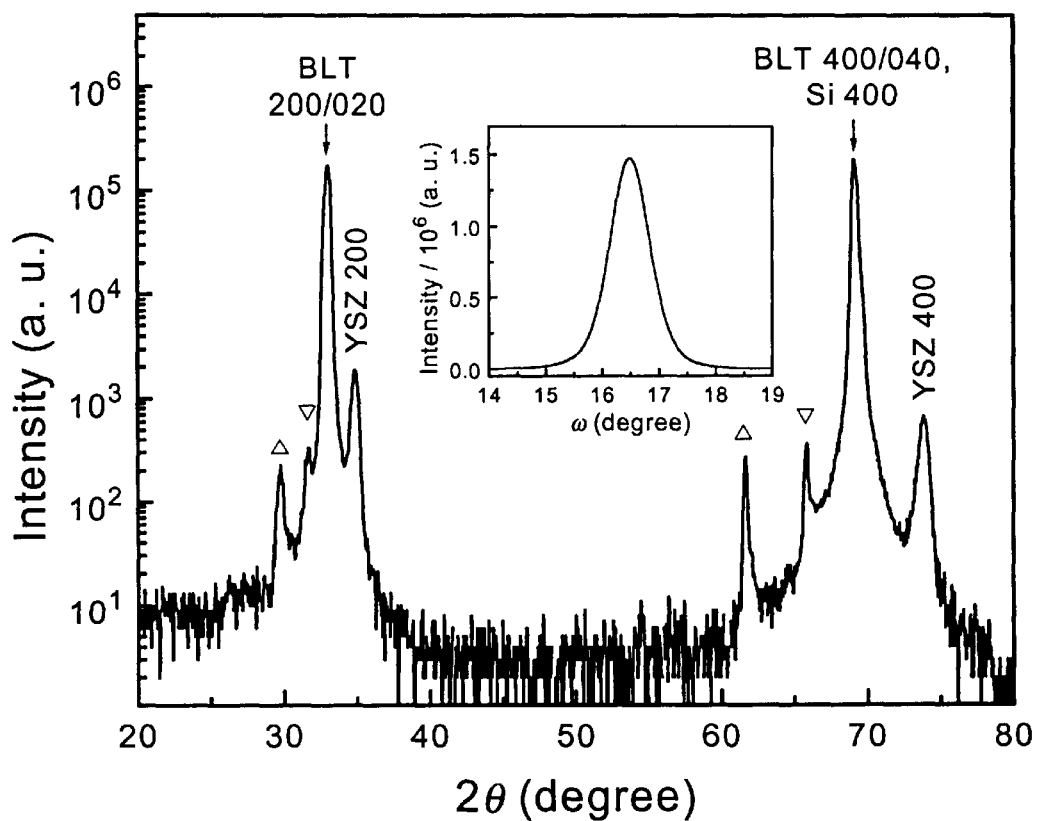
FIG. 13 is an X-ray detraction pattern of an almost purely a-axis-oriented BLT film, with the inset showing an ω scan for the BLT 200/020 peak.
Figure 14:
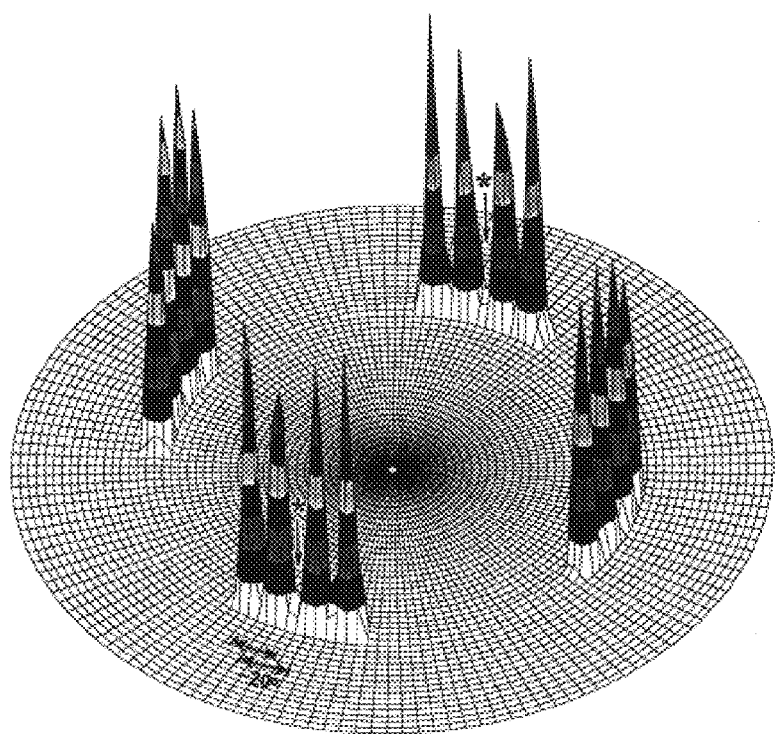
FIG. 14 is a pole figure scan of the structure described by FIG. 13.

The crystallographic orientation, epitaxial relationship, and microstructure of a-axis-oriented BLT films with different values of $\alpha_{(100)}$ have been investigated by XRD scans and transmission electron microscopy (TEM) both in plan-view and cross section geometry. FIGS. 13 and 14 show an XRD θ-2θ scan and a pole figure of the BLT 117 reflection, respectively, recorded from the sample shown in FIG. 11I ($\alpha_{(100)}$=99%). This film was grown under optimized conditions onto YSZ(100)/Si(100) covered with a very thin $SrRuO_3$(110) electrode layer. The BLT 200/020 and the YSZ 200 and 400 peaks are clearly seen. The peaks due to the remaining Cu-K$\beta_1$ and the W-L$\alpha_1$ radiation are labeled as (Δ) and (∇), respectively. $SrRuO_3$ peaks are not visible due to the very low layer thickness. The inset in FIG. 13 shows the 200/020 peak in an ω scan revealing a very good crystallinity (full-width at half maximum (FWHM)=0.83°). Detailed XRD investigations showed that the BLT film has lattice constants a=0.542 nm, b=0.541 nm, and c=3.271 nm. The a-axis orientation and the azimuthal orientation relationship have been analyzed recording several pole figures and φ scans. FIG. 14 is a pole figure using the 117 reflection of the BLT film (2θ=30.2°) shown in FIGS. 13 and 11I. There are four sets of peaks at ψ≈57°, first of all confirming the (100) orientation of the film (tilt angle ∠(100):(117)= 56.9°). Each set of peaks, however, consists of two sub-sets (of two peaks each) with an offset Δφ≈20° as marked in FIG. 14. This phenomenon can easily be explained, if it is assumed that a-axis-oriented BLT grains can nucleate on each of the four $SrRuO_3$ domains schematically shown in FIG. 12, so that four different azimuthal orientations result within one and the same a-axis-oriented BLT film. This fact is analogous to the situation in (118)-oriented films described above. Consequently, the uniformly a-axis-oriented BLT films of the present invention consist of a mix of four azimuthal domains (or twins), which give rise to the grainy structure of the films (cf. FIG. 11I)—a fact that otherwise would be difficult to understand in a uniformly (100)-oriented film. The corresponding epitaxy relationship is BLT(100)∥$SrRuO_3$(110)∥YSZ(100)∥Si(100); BLT[001] ∥$SrRuO_3$[001], where $SrRuO_3$[$\bar{1}$11]∥YSZ(011)∥Si(011) including four azimuthal domains. For other details, cf. Lee et al., "Epitaxial growth of non-c-oriented ferroelectric $SrBi_2Ta_2O_9$ thin films on Si(100) substrates," *Appl. Phys.*, A71, 101 (2000); Lee et al., "Growth and characterization of non-c-oriented epitaxial ferroelectric $SrBi_2Ta_2O_9$ films on buffered Si(100)," *Appl. Phys. Lett.* 77, 3260 (2000).

Figure 15:
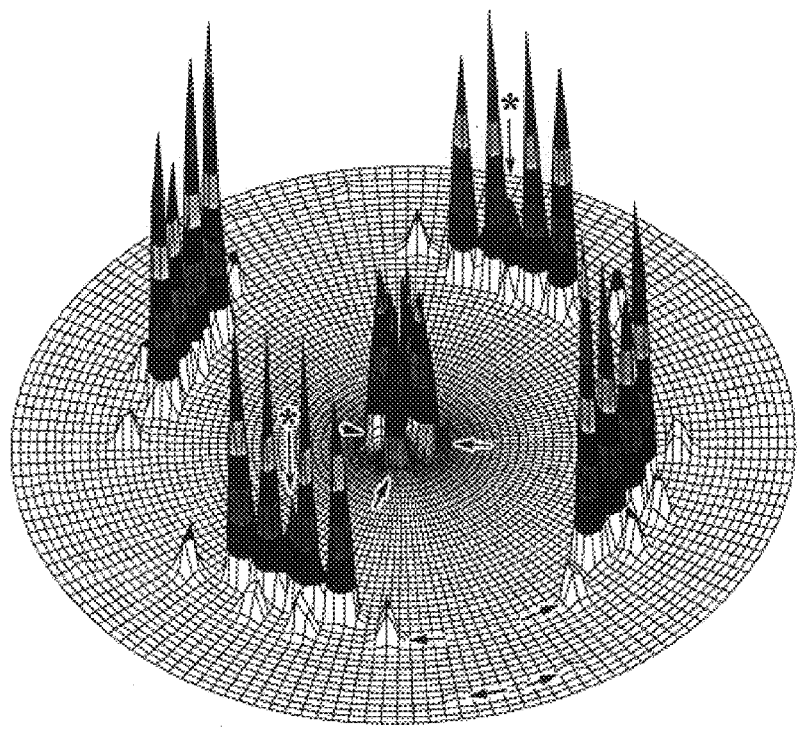
FIG. 15 is a pole figure scan of a BLT film having a mix of (100) and (118) orientations.

FIG. 15 shows a typical pole figure (recorded with the BLT 117 reflection) of a film consisting of a mix of (100) and (118) orientations. In FIG. 15 (and FIG. 14), the peaks labeled (*) originate from a shoulder of the YSZ 111 peak. In addition to peaks from the (100)-oriented part of the film at ψ≈57°, peaks marked by arrows at ψ≈4°, 64°, and 82° corresponding to the 117, 11$\bar{7}$/$\bar{1}$17, and 11$\bar{7}$ reflections, respectively, from the (118)-oriented part of the film have been recorded confirming the presence of the (118) orientation. The (118)-oriented part of the film has the following epitaxial relationship: BLT(118)∥$SrRuO_3$(110)∥YSZ(100)∥Si (100); BLT[1$\bar{1}$0]∥$SrRuO_3$[010], where $SrRuO_3$[ $\bar{1}$11]∥YSZ(011)∥Si(011) including four azimuthal domains.

Figure 16A:
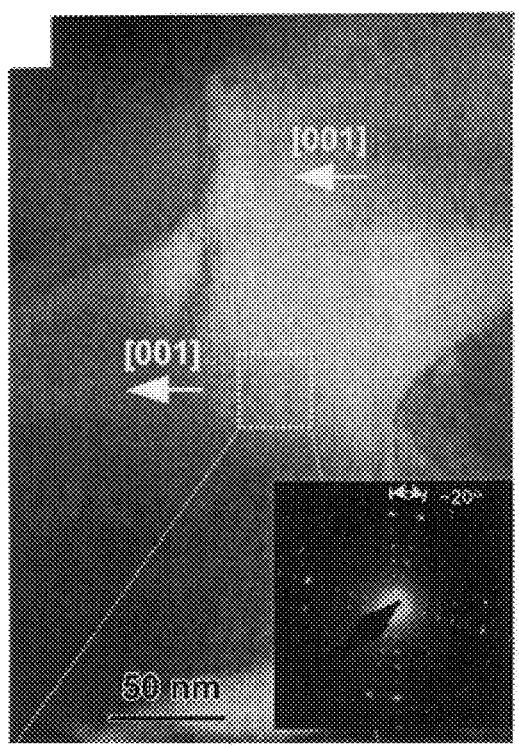
FIG. 16A is a plan-view TEM image of an a-axis-oriented film, with an inset showing electron diffraction pattern of a (100)-oriented area and showing the c axis lying in the film plane.
Figure 16C:
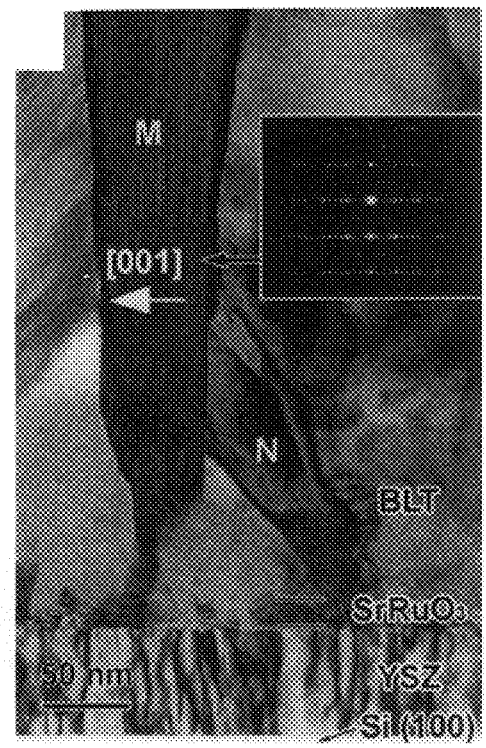
FIG. 16C is a cross-sectional TEM image of an a-axis-oriented film, with an inset showing an electron diffraction pattern of a (100)-oriented area and showing the c axis lying the in the film plane.
Figure 16B:
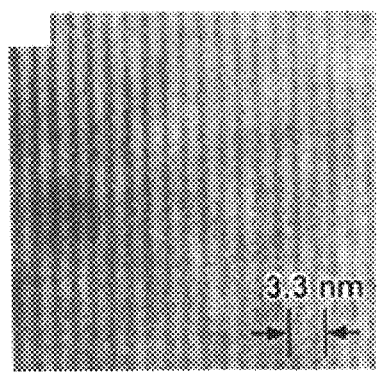
FIG. 16B is another plan-view TEM image of an a-axis-oriented film.
Figure 16D:
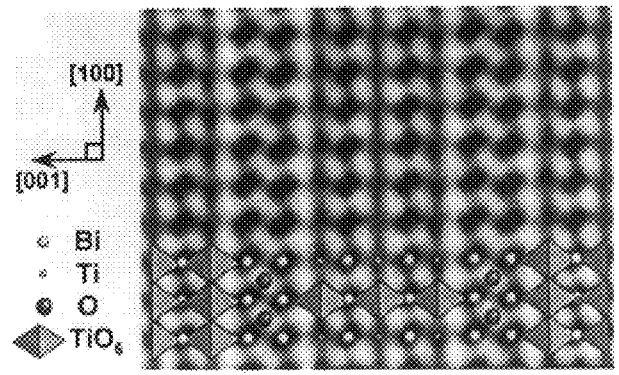
FIG. 16D is another cross-sectional TEM image of an a-axis-oriented film.

TEM investigations including high-resolution structure imaging clearly confirmed the a-axis orientation, as demonstrated in FIGS. 16A–16D. Both plan-view and cross-sectional TEM images of a BLT film with $\alpha_{(100)}$=90% clearly show the (002) lattice fringes perpendicular to the [001] direction, with a spacing of c/2. In plan-view TEM images (FIGS. 16A and 16B), the c axis of the a-axis-oriented grains lies in the film plane. Due to the four azimuthal orientations discussed above, the electron diffraction pattern (inset of FIG. 16A) consists of four rows of BLT (00l) reflections which pairwise include azimuthal difference angles of ~20°. Cross section TEM images of the entire BLT/$SrRuO_3$/YSZ/Si heterostructure (FIG. 16C) and high-resolution TEM investigations of cross-section samples (FIG. 16D) confirm the (100) orientation of the film. In the (100)-oriented BLT grain marked "M" in FIG. 16C, the (002) BLT fringes extending vertically (at an angle of 90° with respect to the film plane) are clearly visualized. The inset shows the corresponding diffraction pattern with the rows of BLT (00l) reflections extending horizontally. The small grain marked "N" is a (118)-oriented grain in which, by close inspection, the (002) fringes can be seen at an angle of 45° with respect to the film plane. In the rest of the visualized film area in FIG. 16C, no fringes can be seen, because the other domains (twins) have azimuthal orientations different from the grains "M" and "N". FIG. 16D shows a high-resolution structure image of the top of grain "M", where the latter is particularly thin (area not shown in FIG. 16C). A rather good correspondence to the inserted structure model of an a-axis-oriented $Bi_4Ti_3O_{12}$ unit cell is observed.

Figure 17:
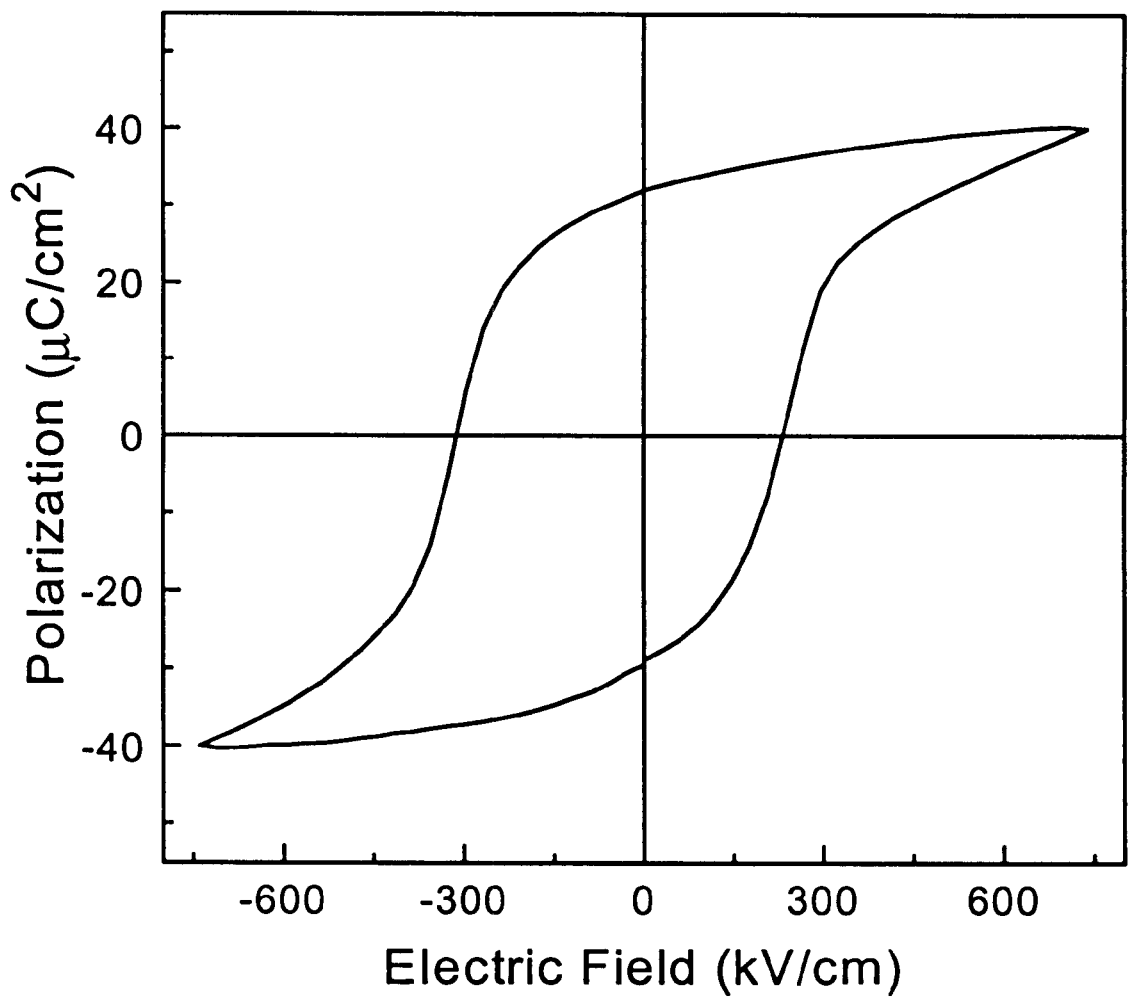
FIG. 17 is a P-E hysteresis loop of a Pt/BLT (100)/$SrRuO_3$ (110) capacitor.

Ferroelectric polarization-electric field (P-E) hysteresis loops of BLT films with the $\alpha_{(100)}$=99% have been recorded at 200 Hz, as shown in FIG. 17. Platinum top electrodes (100 μm in diameter) were sputter-deposited. The a-axis-oriented films revealed well-saturated hysteresis loops with a remanent polarization and a coercive field of 32 μC/cm$^2$ and 265 kV/cm, respectively, for a maximum applied electric field of 740 kV/cm. Although the remanent polarization is lower than that of a $Bi_4Ti_3O_{12}$ single crystal (~50 μC/cm$^2$) in the same orientation, it is a reasonable value for BLT because the La substitution for Bi causes a reduction of the "ferroelectric" structure distortion in such a way as to reduce the spontaneous polarization. Investigations using neutron powder diffraction have shown that the spontaneous polarization of BLT along the a axis is 69% of that of non-doped $Bi_4Ti_3O_{12}$, which corresponds to about 35 μC/cm$^2$. See Shimakawa et al., "Crystal and electronic structures of $Bi_{4-x}La_xTi_3O_{12}$ ferroelectric materials," *Appl. Phys. Lett.,* 79, 2791 (2001). This is well comparable to the measured remanent polarization of 32 $\mu C/cm^2$ in the almost purely a-axis-oriented BLT film of the present invention. Since there is no polarization component along the b-axis direction, the high value of the remanent polarization implies that the film has almost no a-b twins or is totally switched into the a-axis orientation. The coercive field, however, is much higher than the reported value for a single crystal (~50 kV/cm). This is probably due to the high density of structural defects in the thin film caused by azimuthally rotated grains.

From the foregoing example, it can be concluded that almost uniformly oriented high quality a-axis-oriented BLT thin films have been grown by PLD on $SrRuO_3$/YSZ-buffered Si(100) substrates. The suppression of the bismuth and/or bismuth oxide re-evaporation during film growth and the use of strained $SrRuO_3$ bottom electrodes enabled the growth of a-axis-oriented BLT films. The latter revealed a remanent polarization of 32 $\mu C/cm^2$, which could be a lower bound of the spontaneous polarization of BLT thin films.

It therefore can be seen from the foregoing description that the present invention provides a template suitable for promoting the growth of non-c-axis oriented, including a-axis oriented, ferroelectric films. The resulting heterostructures are useful in digital memory applications, such as ferroelectric capacitors, as well as for further investigation into the properties of ferroelectric materials.

What is claimed is:

1. A structure containing a ferroelectric material, the structure comprising:
    (a) a substrate comprising a (100)-oriented material;
    (b) a buffer layer formed on the substrate and having a (100) orientation;
    (c) a template layer formed on the buffer layer and comprising a (110)-oriented perovskite oxide compound; and
    (d) an epitaxially a-axis-oriented ferroelectric layer formed on the template layer and exhibiting a vector of spontaneous polarization oriented substantially normal to a plane of the ferroelectric layer.

2. The structure according to claim 1 wherein the (100)-oriented material of the substrate is a semiconducting material.

3. The structure according to claim 2 wherein the substrate comprises silicon.

4. The structure according to claim 2 wherein the buffer layer comprises yttria-stabilized zirconia.

5. The structure according to claim 4 wherein the perovskite oxide compound comprises strontium ruthenate.

6. The structure according to claim 5 wherein the ferroelectric layer comprises $Bi_4Ti_3O_{12}$.

7. The structure according to claim 6 wherein the ferroelectric layer comprises lanthanum-substituted bismuth titanate.

8. The structure according to claim 5 wherein the ferroelectric layer comprises $SrBi_2Ta_2O_9$.

9. The structure according to claim 4 wherein the perovskite oxide compound comprises lanthanum nickelate.

10. The structure according to claim 9 wherein the ferroelectric layer comprises $Bi_4Ti_3O_{12}$.

11. The structure according to claim 10 wherein the ferroelectric layer comprises lanthanum-substituted bismuth titanate.

12. The structure according to claim 9 wherein the ferroelectric layer comprises $SrBi_2Ta_2O_9$.

13. The structure according to claim 1 wherein the buffer layer comprises yttria-stabilized zirconia.

14. The structure according to claim 1 wherein the perovskite oxide compound of the template layer comprises strontium ruthenate.

15. The structure according to claim 1 wherein the perovskite oxide compound of the template layer comprises lanthanum nickelate.

16. The structure according to claim 1 wherein the ferroelectric layer comprises $Bi_4Ti_3O_{12}$.

17. The structure according to claim 16 wherein the ferroelectric layer comprises a lanthanum-substituted bismuth titanate.

18. The structure according to claim 1 wherein the ferroelectric layer comprises $SrBi_2Ta_2O_9$.

19. The structure according to claim 1 comprising an electrode formed on the ferroelectric layer.

20. A structure containing a ferroelectric material, the structure comprising:
    (a) a substrate comprising a (100)-oriented material;
    (b) a buffer layer formed on the substrate and comprising YSZ (100);
    (c) a template layer formed on the buffer layer and comprising a (110)-oriented perovskite oxide compound; and
    (d) an epitaxially a-axis-oriented ferroelectric layer comprising $Bi_4Ti_3O_{12}$, the ferroelectric layer formed on the template layer and exhibiting a vector of spontaneous polarization oriented substantially normal to a plane of the ferroelectric layer.

21. The structure according to claim 20 wherein the (100)-oriented material of the substrate is a semiconducting material.

22. The structure according to claim 21 wherein the substrate comprises silicon.

23. The structure according to claim 20 wherein the perovskite oxide compound comprises strontium ruthenate.

24. The structure according to claim 20 wherein the perovskite oxide compound comprises lanthanum nickelate.

25. The structure according to claim 20 wherein the $Bi_4Ti_3O_{12}$ of the ferroelectric layer is doped with lanthanum.

26. The structure according to claim 20 comprising an electrically conductive component disposed on the ferroelectric layer.

27. A structure containing a ferroelectric material, the structure comprising:
    (a) a substrate comprising a (100)-oriented material;
    (b) a buffer layer formed on the substrate and comprising YSZ (100);
    (c) a template layer formed on the buffer layer and comprising a (110)-oriented perovskite oxide compound; and
    (d) an epitaxially a-axis-oriented ferroelectric layer comprising $SrBi_2Ti_2O_9$, the ferroelectric layer formed on the template layer and exhibiting a vector of spontaneous polarization oriented substantially normal to a plane of the ferroelectric layer.

28. The structure according to claim 27 wherein the (100)-oriented material of the substrate is a semiconducting material.

29. The structure according to claim 28 wherein the substrate comprises silicon.

30. The structure according to claim 27 wherein the perovskite oxide compound comprises strontium ruthenate.

31. The structure according to claim 27 wherein the perovskite oxide compound comprises lanthanum nickelate.

32. The structure according to claim 27 comprising an electrically conductive component disposed on the ferroelectric layer.

33. A method for epitaxially growing a layer of a-axis oriented ferroelectric material, comprising the steps of:
(a) forming a template layer by depositing a (110)-oriented perovskite oxide compound on a (100)-oriented substrate buffered with a (100)-oriented buffer layer; and
(b) growing an epitaxially a-axis oriented ferroelectric layer on the template layer, whereby the ferroelectric layer exhibits a vector of spontaneous polarization oriented substantially normal to a plane of the ferroelectric layer.

34. The method according to claim 33 comprising the step of selecting a semiconducting material for the substrate.

35. The method according to claim 33 comprising the step of selecting YSZ for the buffer layer.

36. The method according to claim 33 comprising the step of selecting strontium ruthenate for the perovskite oxide compound.

37. The method according to claim 33 comprising the step of selecting lanthanum nickelate for the perovskite oxide compound.

38. The method according to claim 33 wherein the ferroelectric material comprises $Bi_4Ti_3O_{12}$.

39. The method according to claim 33 wherein the ferroelectric material comprises $SrBi_2Ti_2O_9$.

40. The method according to claim 33 wherein the perovskite oxide compound is deposited to a thickness of approximately 10 to approximately 15 nm.

41. The method according to claim 33 wherein the step of growing the ferroelectric layer comprises depositing the material of the ferroelectric layer at a rate of approximately 100 to approximately 200 nm/min to promote growth of (100)-oriented nuclei.

42. The method according to claim 33 comprising the step of maintaining an oxygen pressure of approximately 0.9 mbar to approximately 5 mbar during growth of the ferroelectric layer to suppress re-evaporation of bismuth-containing species.

43. A structure produced according to the method of claim 33.

* * * * *